United States Patent
Takahashi

(10) Patent No.: US 9,721,959 B2
(45) Date of Patent: Aug. 1, 2017

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Kei Takahashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 65 days.

(21) Appl. No.: 14/295,455

(22) Filed: Jun. 4, 2014

(65) Prior Publication Data
US 2014/0367673 A1    Dec. 18, 2014

(30) Foreign Application Priority Data
Jun. 13, 2013  (JP) ................. 2013-124508

(51) Int. Cl.
| | |
|---|---|
| H01L 27/1156 | (2017.01) |
| H01L 27/12 | (2006.01) |
| H01L 29/786 | (2006.01) |
| G11C 11/24 | (2006.01) |
| G11C 13/00 | (2006.01) |

(52) U.S. Cl.
CPC .......... *H01L 27/1156* (2013.01); *G11C 11/24* (2013.01); *H01L 27/1225* (2013.01); *H01L 27/1229* (2013.01); *H01L 29/7869* (2013.01); *H01L 29/78696* (2013.01); *G11C 13/0007* (2013.01)

(58) Field of Classification Search
USPC .......................................... 257/43
See application file for complete search history.

(56) References Cited

U.S. PATENT DOCUMENTS

| | | |
|---|---|---|
| 4,466,081 A | 8/1984 | Masuoka |
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Yu Chen
*Assistant Examiner* — Nilufa Rahim
(74) *Attorney, Agent, or Firm* — Fish & Richardson P.C.

(57) ABSTRACT

To provide a semiconductor device that holds data even when power supply is stopped. The semiconductor device includes a first transistor, a second transistor, a third transistor, and a capacitor. One of a source electrode and a drain electrode of the first transistor is electrically connected to one of a source electrode and a drain electrode of the third transistor and one electrode of the capacitor. A gate electrode of the second transistor is electrically connected to the other of the source electrode and the drain electrode of the third transistor.

22 Claims, 18 Drawing Sheets

(56) References Cited

U.S. PATENT DOCUMENTS

| | | |
|---|---|---|
| 6,198,652 B1 | 3/2001 | Kawakubo et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,289,753 B2 | 10/2012 | Yamazaki et al. |
| 8,363,452 B2 | 1/2013 | Yamazaki et al. |
| 8,530,285 B2 | 9/2013 | Yamazaki et al. |
| 8,659,941 B2 | 2/2014 | Kamata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0182223 A1* | 7/2010 | Choi .................. G09G 3/3233 345/76 |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0122673 A1 | 5/2011 | Kamata et al. |
| 2011/0140100 A1* | 6/2011 | Takata et al. .................. 257/43 |
| 2012/0062538 A1* | 3/2012 | Koyama ....................... 345/211 |
| 2012/0319102 A1* | 12/2012 | Yamazaki et al. .............. 257/43 |
| 2013/0228773 A1 | 9/2013 | Kurokawa |
| 2013/0272055 A1 | 10/2013 | Yamamoto |
| 2013/0286757 A1 | 10/2013 | Takemura |
| 2013/0320330 A1 | 12/2013 | Yamazaki |
| 2013/0320334 A1 | 12/2013 | Yamazaki et al. |
| 2014/0042433 A1 | 2/2014 | Yamazaki |
| 2014/0077205 A1 | 3/2014 | Yamazaki et al. |
| 2014/0339560 A1 | 11/2014 | Yamazaki et al. |
| 2014/0340116 A1 | 11/2014 | Okamoto et al. |

FOREIGN PATENT DOCUMENTS

| | | |
|---|---|---|
| JP | 57-105889 A | 7/1982 |
| JP | 63-210022 A | 8/1985 |
| JP | 60-198861 A | 10/1985 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Trans-

(56) References Cited

OTHER PUBLICATIONS actions on Electron Devices, Jul. 1, 1995, vol. 42. No. 7, pp. 1240-1246.
Cho.D et al., "21.2:Al and Sn-Doped Zinc Indium Oxide Thin Film Transistors for AMOLED Back-Plane", SID Digest '09: SID International Symposium: Digest of Technical Papers, May 31, 2009, pp. 280-283.
Clark.S et al.. "First Principles Methods Using Castep", Zeitschrift fur Kristallographie 2005, vol. 220, pp. 567-570.
Coates.D et al., "Optical Studies of the Amorphous Lioiud-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. (Applied Physics Letters) , Sep. 27, 2004. vol. 85, No. 13, pp. 2541-2543.
Fung.T et al., "2-D Numerical Simulation of High Performance Amorphous In—Ga—Zn—O TFTs for Flat Panel Displays", AM-FPD '98 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09: SID International Symposium Digest of Technical Papers, May 31, 2009, pp. 1110-1112.
Godo.H: et al., "Temperature Dependence of Characteristics and Electronic Structure for Amorphous In—Ga—Zn-Oxide TFT", AM-FPD '09 Digest of Technical Papers. Jul. 1, 2099, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Then-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H. "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39. pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies In ZnO", Appl. Phys. Lett. (Applied Physics Letters) , 2005. vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (15.5') Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et. al., "Spinel,YbFe2O4, and Yb2Fe3O7 Types of Structures for Compounds in the In2O3 and Sc2O3—A2O3—BO Systems [A; Fe, Ga, or, Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal: Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H, et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda..S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M. "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991 , vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K. et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hachw-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. OVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-210, The Japan Society of Applied Physics.

Orita.M et al., "Amorphous transparent conductive oxide InGaO3(ZnO)m (m <4): a Zn4s conductor", Philosophical Magazine, 2001, vol. 81. No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3. pp. 1811-1816.

Osada.T et al., "15:2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-iuduced damage to optical properties", J. Vac. Sci. Technol. B (Journal of Vacuum Science & Technology B), Mar. 1, 2003. vol. 21, No. 2, pp. 800-803.

Park.J et al., "Electronic Transport Properties of Amorphous Indilim-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure",IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003. vol. 83, No. 9, pp. 1755-1757.

Van de Wafle.C, "Hydrogen as a Cause of Doping in Zinc Oxide", Phys. Rev. Lett. (Physical Review Letters), Jul. 31, 2000, vol. 85, No. 5. pp. 1012-1015.

\* cited by examiner

SEMICONDUCTOR DEVICE

BACKGROUND OF THE INVENTION

1. Field of the Invention

The present invention relates to a semiconductor device.

Note that one embodiment of the present invention is not limited to the above technical field. The technical field of one embodiment of the present invention disclosed in this specification and the like relates to an object, a method, or a manufacturing method. Further, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

In this specification and the like, a semiconductor device means any device that can function by utilizing semiconductor characteristics. A transistor and a semiconductor circuit are embodiments of semiconductor devices. A storage device, a display device, or an electronic device may include a semiconductor device.

2. Description of the Related Art

Storage devices using semiconductor elements are broadly classified into two categories: a volatile storage device that loses stored data when power supply stops, and a non-volatile storage device that holds stored data even when power supply stops.

A typical example of a volatile storage device is a dynamic random access memory (DRAM). A DRAM stores data in such a manner that a transistor included in a storage element is selected and charge is accumulated in a capacitor.

When data is read from a DRAM, charge in a capacitor is lost according to the above principle; thus, another writing operation is needed whenever data is read. Moreover, a transistor in a storage element that is in an off state has a leakage current (off-state current) between a source and a drain or the like and thus charge flows into or out of a capacitor, which makes a data holding period short. Accordingly, writing operation (refresh operation) needs to be performed at predetermined intervals, resulting in relatively high power consumption. Furthermore, since stored data is lost when power supply stops, an additional storage device using a magnetic material or an optical material is needed in order to hold the data for a long time.

Another example of a volatile storage device is a static random access memory (SRAM). An SRAM holds stored data by using a circuit such as a flip-flop and thus does not need refresh operation, which is an advantage over a DRAM. An SRAM, however, has a problem that cost per storage capacity is increased because the occupation area of a flip-flop is large. Furthermore, as in a DRAM, stored data in an SRAM is lost when power supply stops.

A typical example of a nonvolatile storage device is a flash memory. A flash memory includes a floating gate between a gate electrode and a channel formation region of a transistor and stores data by holding charge in the floating gate. Therefore, a flash memory has advantages in that a data holding period is extremely long (almost permanent) and refresh operation needed in a volatile storage device is not needed (e.g., see Patent Document 1).

However, a gate insulating layer included in a storage element deteriorates owing to a tunneling current generated in writing, so that the storage element stops its function after a predetermined number of times of writing. In order to reduce effects of this problem, a method in which the number of times of writing for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, a high voltage is necessary for a flash memory in order to inject charge into the floating gate or removing the charge, and a circuit therefore is required. Further, it takes a relatively long time to inject or remove charge, and it is not easy to increase the speed of writing or erasing data.

REFERENCE

[Patent Document 1] Japanese Published Patent Application No. S57-105889

SUMMARY OF THE INVENTION

In view of the above problems, an object of one embodiment of the present invention is to provide a semiconductor device that can hold data even when power supply is stopped. Another object is to provide a semiconductor device in which there is no limitation on the number of times of writing. Another object is to provide a semiconductor device with low power consumption. Another object is to provide a semiconductor device with high reliability. Another object is to provide a highly integrated semiconductor device. Another object is to provide a semiconductor device with excellent data holding capability. Another object is to provide a semiconductor device where data is written and read at high speed. Another object is to provide a novel semiconductor device or the like.

Note that the descriptions of these objects do not disturb the existence of other objects. Note that one embodiment of the present invention does not necessarily achieve all the objects. Objects other than the above objects will be apparent from and can be derived from the descriptions of the specification, the drawings, the claims, and the like.

One embodiment of the present invention disclosed in this specification relates to a semiconductor device including a transistor formed using an oxide semiconductor, a transistor formed using a semiconductor material other than an oxide semiconductor, and a capacitor.

Another embodiment of the present invention is a semiconductor device including a first transistor, a second transistor, a third transistor, and a capacitor. One of a source electrode and a drain electrode of the first transistor is electrically connected to one of a source electrode and a drain electrode of the third transistor and one electrode of the capacitor. A gate electrode of the second transistor is electrically connected to the other of the source electrode and the drain electrode of the third transistor.

Note that in this specification and the like, ordinal numbers such as "first" and "second" are used in order to avoid confusion among components and do not limit the components numerically.

Another embodiment of the present invention is a semiconductor device including a first transistor, a second transistor, a third transistor, and a capacitor. One of a source electrode and a drain electrode of the first transistor is electrically connected to one of a source electrode and a drain electrode of the third transistor and one electrode of the capacitor. A gate electrode of the second transistor is electrically connected to the other of the source electrode and the drain electrode of the third transistor. The other of the source electrode and the drain electrode of the first transistor is electrically connected to a first wiring. A gate electrode of the first transistor is electrically connected to a second wiring. One of a source electrode and a drain electrode of the second transistor is electrically connected to a third wiring. The other of the source electrode and the drain electrode of the second transistor is electrically connected to a fourth wiring. A gate electrode of the third transistor is electrically connected to a fifth wiring. The other electrode of the capacitor is electrically connected to a sixth wiring.

The first and third transistors each include an oxide semiconductor layer, the source electrode and the drain electrode in contact with the oxide semiconductor layer, a gate insulating film in contact with the oxide semiconductor layer and the source and drain electrodes, and the gate electrode overlapping with the oxide semiconductor layer with the gate insulating film interposed therebetween.

The oxide semiconductor layer may have a layered structure where a third oxide semiconductor layer, a second oxide semiconductor layer, and a first oxide semiconductor layer are stacked in this order on the gate insulating film side.

In the oxide semiconductor layer having the layered structure, it is preferable that the energy of the bottom of the conduction band of each of the first and third oxide semiconductor layers be closer to a vacuum level than the bottom of the conduction band of the second oxide semiconductor layer is, by 0.05 eV or more and 2 eV or less.

It is preferable that the first to third oxide semiconductor layers are each an In-M-Zn oxide (M is Al, Ti, Ga, Y, Zr, La, Ce, Nd, or Hf), and that the atomic ratio of M to In in each of the first oxide semiconductor layer and the third oxide semiconductor layer be higher than the atomic ratio of M to In in the second oxide semiconductor layer.

The one of the source electrode and the drain electrode of the third transistor may be electrically connected to one electrode of a switch, and the other electrode of the switch may be electrically connected to the fourth wiring.

The first wiring may be electrically connected to the third wiring.

The fourth wiring may be electrically connected to the sixth wiring.

According to one embodiment of the present invention, it is possible to provide a semiconductor device that can hold data even when power supply is stopped, a semiconductor device in which there is no limitation on the number of times of writing, a semiconductor device with low power consumption, a semiconductor device with high reliability, a highly integrated semiconductor device, a semiconductor device with excellent data holding capability, a semiconductor device where data is written and read at high speed, a novel semiconductor device, or the like.

BRIEF DESCRIPTION OF THE DRAWINGS

In the accompanying drawings.

DETAILED DESCRIPTION OF THE INVENTION

Figure 1:
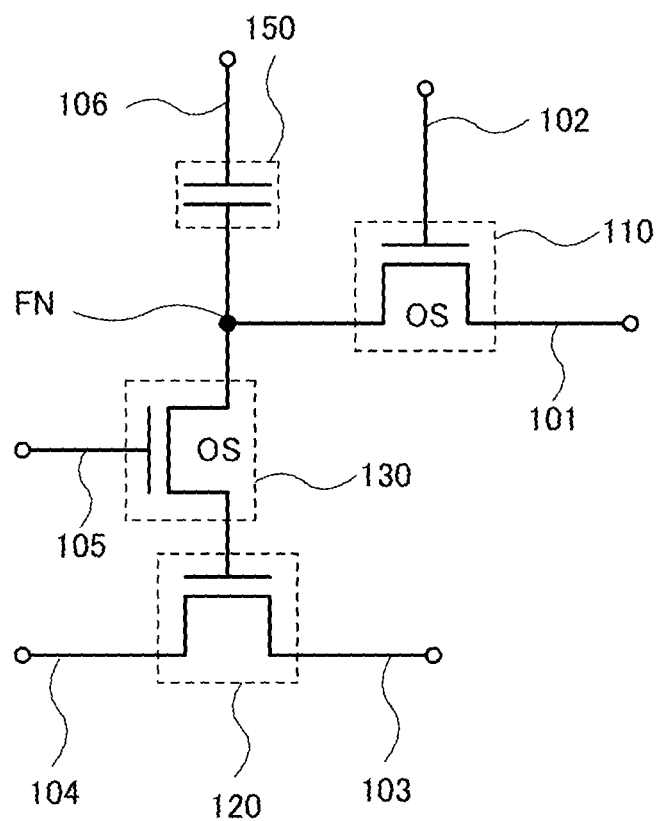
FIG. 1 is a circuit diagram of a semiconductor device.

Embodiments will be described in detail with reference to drawings. Note that the present invention is not limited to the following descriptions and it will be readily appreciated by those skilled in the art that modes and details can be modified in various ways without departing from the spirit and scope of the present invention. Therefore, the present invention should not be interpreted as being limited to the descriptions of the embodiments below. Note that in structures of the present invention described below, the same portions or portions having similar functions are denoted by the same reference numerals in different drawings, and descriptions thereof are not repeated in some cases.

Note that in this specification and the like, the explicit expression "X and Y are connected" can mean that X and Y are electrically connected, that X and Y are functionally connected, and that X and Y are directly connected. Here, X and Y each denote an object (e.g., a device, an element, a circuit, a wiring, an electrode, a terminal, a conductive film, or a layer). Accordingly, another element may be interposed between elements having a connection relation shown in drawings and texts, without limiting to a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is turned on or off to determine whether current flows. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; and/or a control circuit) can be connected between X and Y. Note that for example, when a signal output from X is transmitted to Y, it can be said that X and Y are functionally connected even if another circuit is provided between X and Y.

Note that the explicit expression "X and Y are connected" can mean that X and Y are electrically connected (i.e., X and Y are connected with another element or circuit interposed therebetween), that X and Y are functionally connected (i.e., X and Y are functionally connected with another circuit interposed therebetween), and that X and Y are directly connected (i.e., X and Y are connected without another element or circuit interposed therebetween). That is, the explicit expression "X and Y are electrically connected" is the same as the explicit simple expression "X and Y are connected".

Even when independent components are electrically connected to each other in a circuit diagram, one component may have functions of a plurality of components. For example, when part of a wiring also functions as an electrode, one conductive film functions as the wiring and the electrode. Thus, "electrical connection" in this specification includes in its category such a case where one conductive film has functions of a plurality of components.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to a part of Z1 and another part of Z1 is directly connected to X while a drain (or a second terminal or the like) of the transistor is directly connected to a part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are just examples and there is no limitation on the expressions. Here, X, Y, Z1, and Z2 each denote an object (e.g., a device, an element, a circuit, a wiring, an electrode, a terminal, a conductive film, or a layer).

Note that in this specification and the like, a transistor can be formed using any of a variety of substrates. The type of a substrate is not limited to a certain type. Examples of the substrate include a semiconductor substrate (e.g., a single crystal substrate and a silicon substrate), an SOI substrate, a glass substrate, a quartz substrate, a plastic substrate, a metal substrate, a stainless steel substrate, a substrate containing stainless steel foil, a tungsten substrate, a substrate containing tungsten foil, a flexible substrate, an attachment film, paper containing a fibrous material, and a base material film. Examples of the glass substrate include a barium borosilicate glass substrate, an aluminoborosilicate glass substrate, and a soda lime glass substrate. Examples of the flexible substrate include flexible synthetic resin such as plastics typified by polyethylene terephthalate (PET), polyethylene naphthalate (PEN), and polyether sulfone (PES), and acrylic. Examples of the attachment film include polypropylene, polyester, polyvinyl fluoride, and polyvinyl chloride. Examples of the base material film include polyester, polyamide, polyimide, an inorganic vapor deposition film, and paper. Specifically, when transistors are formed using a semiconductor substrate, a single crystal substrate, an SOI substrate, or the like, it is possible to form transistors with few variations in characteristics, size, shape, or the like and with high current supply capability and a small size. By forming a circuit with the use of such transistors, low power consumption or high integration of the circuit can be achieved.

Alternatively, a flexible substrate may be used as the substrate, and the transistor may be provided directly on the flexible substrate. Still alternatively, a separation layer may be provided between the substrate and the transistor. The separation layer can be used when part or the whole of a semiconductor device formed over the separation layer is separated from the substrate and transferred to another substrate. In such a case, the transistor may be transferred to a substrate having low heat resistance or a flexible substrate. For the separation layer, a stack including inorganic films, a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrates over which transistors can be formed, a paper substrate, a cellophane substrate, an aramid film substrate, a polyimide film substrate, a stone substrate, a wood substrate, cloth substrates (including a natural fiber (e.g., silk, cotton, and hemp), a synthetic fiber (e.g., nylon, polyurethane, and polyester), and a regenerated fiber (e.g., acetate, cupra, rayon, and regenerated polyester)), a leather substrate, and a rubber substrate. By using such a substrate, a transistor with excellent properties or a transistor with low power consumption can be formed, a device with high durability can be formed, heat resistance can be provided, or reduction in weight or thickness can be achieved.

Embodiment 1

In this embodiment, an example of a semiconductor device (storage device) of one embodiment of the present invention will be described with reference to drawings.

FIG. 1 is a circuit diagram of a semiconductor device (storage device) that can hold stored data even when power is not supplied and that has no limitation on the number of times of writing.

The semiconductor device illustrated in FIG. 1 includes a first transistor 110, a second transistor 120, a third transistor 130, and a capacitor 150. One of a source electrode and a drain electrode of the first transistor 110 is electrically connected to one of a source electrode and a drain electrode of the third transistor 130 and one electrode of the capacitor 150. A gate electrode of the second transistor 120 is electrically connected to the other of the source electrode and the drain electrode of the third transistor 130. The other of the source electrode and the drain electrode of the first transistor 110 is electrically connected to a first wiring 101. A gate electrode of the first transistor 110 is electrically connected to a second wiring 102. One of a source electrode and a drain electrode of the second transistor 120 is electrically connected to a third wiring 103. The other of the source electrode and the drain electrode of the second transistor 120 is electrically connected to a fourth wiring 104. The other electrode of the capacitor 150 is electrically connected to a sixth wiring 106.

Figure 2:
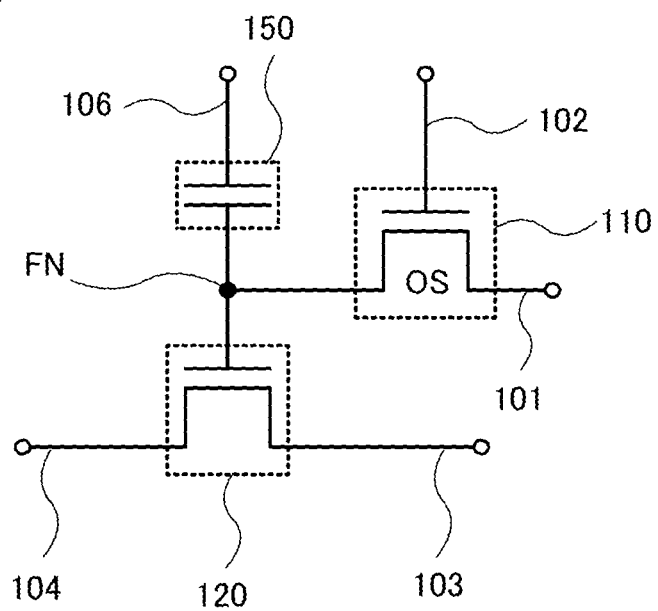
FIG. 2 is a circuit diagram of a semiconductor device.

FIG. 2 is a circuit diagram of another example of a semiconductor device (storage device) that can hold stored data even when power is not supplied and that has no limitation on the number of times of writing. In the following description, common components in the semiconductor devices in FIGS. 1 and 2 are denoted by the same reference numerals.

The semiconductor device illustrated in FIG. 2 includes the first transistor 110, the second transistor 120, and the capacitor 150. The one of the source electrode and the drain electrode of the first transistor 110 is electrically connected to the gate electrode of the second transistor 120 and the one electrode of the capacitor 150. The other of the source electrode and the drain electrode of the first transistor 110 is electrically connected to the first wiring 101. The gate electrode of the first transistor 110 is electrically connected to the second wiring 102. The one of the source electrode and the drain electrode of the second transistor 120 is electrically connected to the third wiring 103. The other of the source electrode and the drain electrode of the second transistor 120 is electrically connected to the fourth wiring 104. The other electrode of the capacitor 150 is electrically connected to the sixth wiring 106.

The first transistor 110 and the second transistor 120 are preferably formed using materials of channel formation regions having band gaps different from each other. For example, the first transistor 110 can be formed using an oxide semiconductor, and the second transistor 120 can be formed using a semiconductor material (silicon or the like) other than an oxide semiconductor.

A transistor formed using an oxide semiconductor enables charge to be held for a long time owing to its characteristics of a significantly low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer. On the other hand, a transistor including a material other than an oxide semiconductor, such as crystal silicon, can operate at high speed easily. Thus, the use of both the transistors enables fabrication of a storage device that has a high capability of holding data and that operates at high speed. In circuit diagrams of this specification, "OS" is written beside a transistor that is preferably formed using an oxide semiconductor.

Note that the first transistor 110 and the second transistor 120 may each be formed using an oxide semiconductor. Alternatively, the first transistor 110 and the second transistor 120 may each be formed using a semiconductor material (e.g., silicon) other than an oxide semiconductor.

The semiconductor device in FIG. 2 utilizes a feature that the potential of the gate electrode of the second transistor 120 can be held, and thus enables writing, holding, and reading of data as follows.

Writing and holding of data will be described. First, the potential of the second wiring 102 is set to a potential at which the first transistor 110 is turned on, so that the first transistor 110 is turned on.

By the above operation, the potential of the first wiring 101 is supplied to the gate electrode of the second transistor 120 and the capacitor 150. In other words, predetermined charge is supplied to a node FN (data writing). Here, charge for supplying either of two different potential levels (hereinafter referred to as low-level charge and high-level charge) is supplied.

After that, the potential of the second wiring 102 is set to a potential at which the first transistor 110 is turned off to turn off the first transistor 110, whereby charge supplied to the node FN is held (data holding). Since the off-state current of the first transistor 110 is extremely low, charge in the node FN is held for a long time.

Next, data reading will be described. An appropriate potential (reading potential) is supplied to the sixth wiring 106 while a predetermined potential (constant potential) is supplied to the fourth wiring 104, whereby the potential of the third wiring 103 varies depending on the amount of charge held in the node FN.

In general, in the case where the second transistor 120 is an n-channel transistor, an apparent threshold voltage $V_{th\_H}$ when high-level charge is supplied to the gate electrode of the second transistor 120 (the node FN) is lower than an apparent threshold voltage $V_{th\_L}$ when low-level charge is supplied to the gate electrode of the second transistor 120 (the node FN).

Here, the apparent threshold voltage refers to the potential of the sixth wiring 106 needed to turn on the second transistor 120. Thus, the potential of the sixth wiring 106 is set to a potential $V_0$ that is between $V_{th\_H}$ and $V_{th\_L}$, whereby charge supplied to the gate electrode (node FN) of the second transistor 120 can be determined.

For example, in the case where the high-level charge is supplied in writing, when the potential of the sixth wiring 106 is set to $V_0$ ($>V_{th\_H}$), the second transistor 120 is turned on. In the case where a low-level charge is supplied in writing, even when the potential of the sixth wiring 106 is set to $V_0$ ($V_{th\_1}$), the second transistor 120 remains off. Therefore, held data can be read by determining the potential of the third wiring 103.

Note that in the case where memory cells are arrayed to be used, only data of desired memory cells needs to be read. The sixth wirings 106 of memory cells from which data is not read are supplied with a potential at which the second transistor 120 is turned off regardless of the potential supplied to the gate electrode, that is, a potential lower than $V_{th\_H}$. Alternatively, the sixth wirings 106 are supplied with a potential at which the second transistor 120 is turned on regardless of the potential supplied to the gate electrode, that is, a potential higher than $V_{th\_L}$.

When a transistor that has a channel formation region formed using an oxide semiconductor and thus has an extremely low off-state current is applied to the semiconductor device illustrated in FIG. 2, the semiconductor device can hold stored data for an extremely long period. In other words, refresh operation becomes unnecessary or the frequency of refresh operation can be extremely low, resulting in sufficient reduction in power consumption. Moreover, stored data can be held for a long period even when power is not supplied (note that a potential is preferably fixed). Note that power may be supplied while the stored data is held.

In the above driving method, a high voltage is not needed to write data to the node FN, and a problem such as deterioration of the second transistor 120 does not occur. For example, unlike a conventional nonvolatile memory, it is not necessary to inject and extract electrons into and from a floating gate by application of a high voltage, and thus a problem such as deterioration of a gate insulating film of the second transistor 120 does not occur. In other words, the semiconductor device of one embodiment of the disclosed invention does not have a limit on the number of times of writing, which is a problem in a conventional nonvolatile memory, and reliability thereof is drastically improved. Furthermore, data is written depending on on/off of the transistor, which facilitates high-speed operation.

Meanwhile, as a transistor is miniaturized, the thickness of a gate insulating film needs to be reduced in order to maintain capacitance. With a gate insulating film having a small thickness, a gate leakage current is increased because of a tunneling current. Thus, in the semiconductor device described above, charge held in the capacitor 150 might be released through the second transistor 120.

Figure 3:
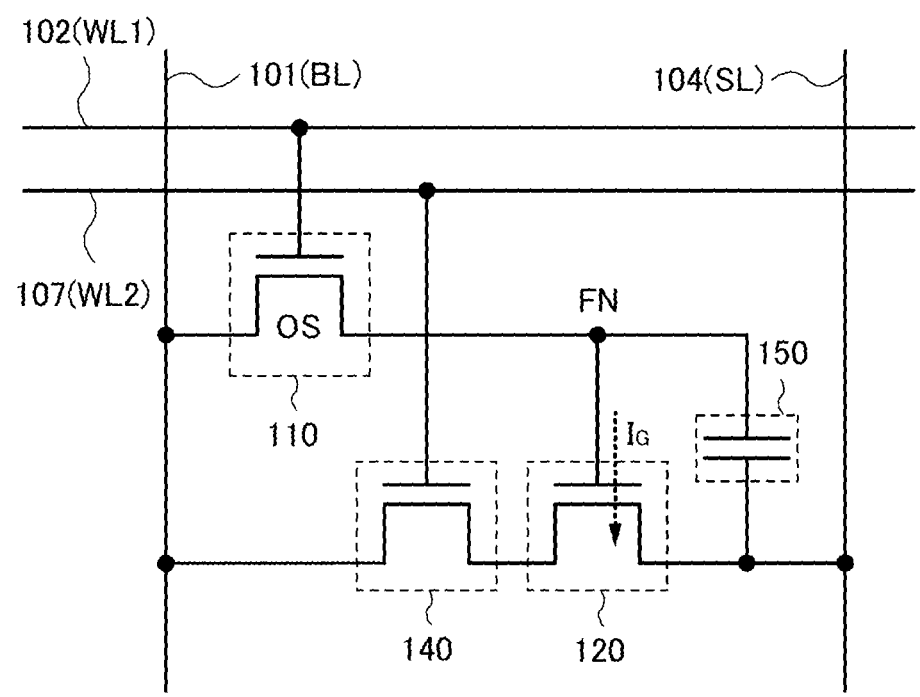
FIG. 3 is a circuit diagram of a semiconductor device.

FIG. 3 is a circuit diagram illustrating a specific connection state of the semiconductor device illustrated in FIG. 2, a fourth transistor 140 that operates as a read selection switch, and wirings.

The first wiring 101 can serve as a bit line (BL), the second wiring 102 can serve as a word line (WL1) for writing data, the fourth wiring 104 can serve as a reference potential line (SL), and a seventh wiring 107 can serve as a word line (WL2) for reading data. Note that in the circuit diagram in FIG. 3, the first wiring 101 also serves as the third wiring 103 illustrated in FIG. 2, and the fourth wiring 104 also serves as the sixth wiring 106.

Figure 4:
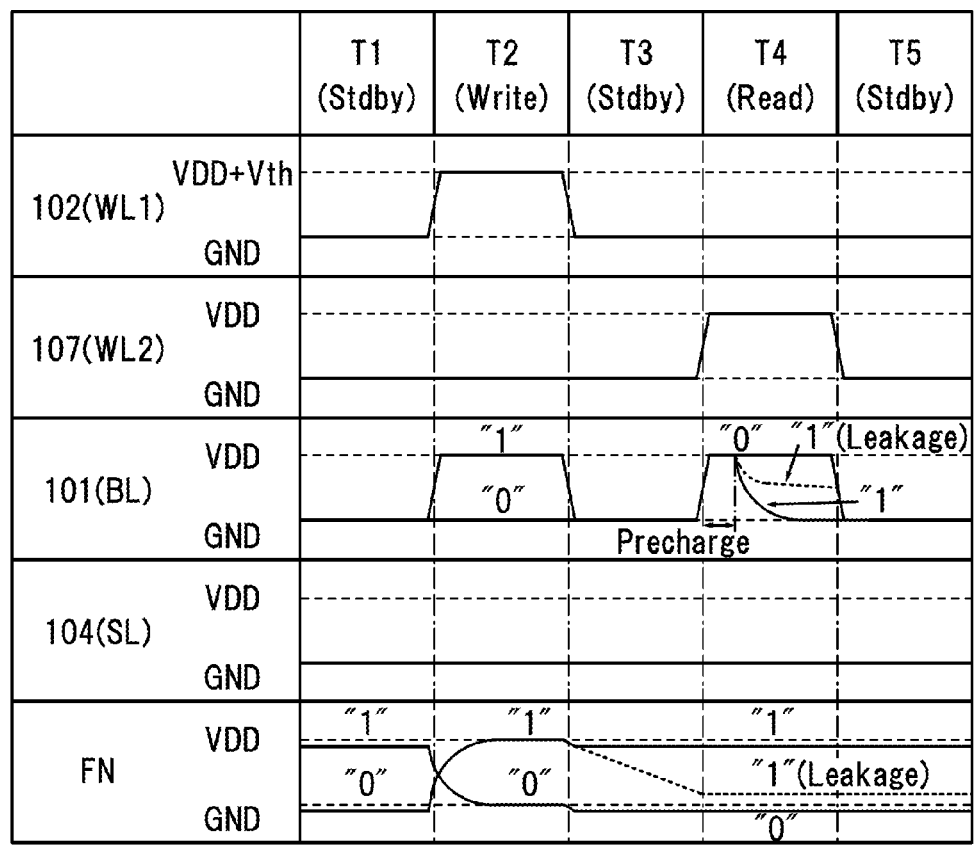
FIG. 4 is a timing chart showing operation of a semiconductor device.

FIG. 4 is an example of a timing chart showing operation of a semiconductor device constructed according to the circuit diagram in FIG. 3. In FIG. 4, the potentials of wirings and the node FN are shown.

First, the potential of the node FN is either at a high level (for example, VDD (hereinafter referred to as "1")) or at a low level (for example, GND (hereinafter referred to as "0")) in a standby period T1. The potential of the fourth wiring 104 (SL) is normally low (for example, GND).

Next, in a writing period T2, the potential of the first wiring 101 (BL) is set to "1" or "0", and the potential of the second wiring 102 (WL1) is set to higher than or equal to a high potential (for example, VDD+the threshold voltage of the first transistor 110) so that the first transistor 110 is turned on, whereby "1" or "0" is written to the node FN.

When the first transistor 110 is turned off in a standby period T3 after the writing period T2, ideally, the potential of the node FN is held owing to an effect of an extremely low off-state current of the transistor. However, in the case where "1" is written to the node FN and the gate leakage current ($I_G$) of the second transistor 120 is high, charge leaks from the capacitor 150, and thus, the potential of the node FN is lowered as shown by a dotted line in the chart.

In an early stage of a reading period T4 after the standby period T3, the potential of the first wiring 101 (BL) is precharged to a high potential (for example, VDD), and the potential of the seventh wiring 107 is set to a high potential (for example, VDD), so that the fourth transistor 140 serving as a selection switch is turned on and the potential of the first wiring 101 is changed in accordance with the potential of the node FN.

In the case where "1" is written to the node FN and the gate leakage current ($I_G$) of the second transistor 120 is negligible, the potential of the first wiring 101 (BL) rapidly becomes closer to GND; accordingly, "1" can be read.

On the other hand, in the case where the gate leakage current ($I_G$) of the second transistor 120 is high, the potential of the node FN is lowered, so that the on-state current of the second transistor 120 becomes lower than or equal to a predetermined value. Therefore, the potential of the first wiring 101 (BL) is not sufficiently lowered to GND as shown by a dotted line in the chart. For this reason, "1" cannot be accurately read in some cases.

To solve the above problems, the semiconductor device of one embodiment of the present invention has the circuit configuration illustrated in FIG. 1. The semiconductor device in FIG. 1 is different from the semiconductor device in FIG. 2 in that the third transistor 130 is connected between the node FN and the second transistor 120. Specifically, the one of the source electrode and the drain electrode of the third transistor 130 is electrically connected to the node FN, and the other of the source electrode and the drain electrode of the third transistor 130 is electrically connected to the gate electrode of the second transistor 120. A gate electrode of the third transistor 130 is electrically connected to the fifth wiring 105.

Like the first transistor 110, the third transistor 130 is preferably a transistor formed using an oxide semiconductor having an extremely low off-state current. The use of the transistor formed using an oxide semiconductor as the third transistor 130 allows the potential of the node FN to be held without any change when the third transistor 130 is turned off, even in the case where the gate leakage current ($I_G$) of the second transistor 120 is high.

Figure 5:
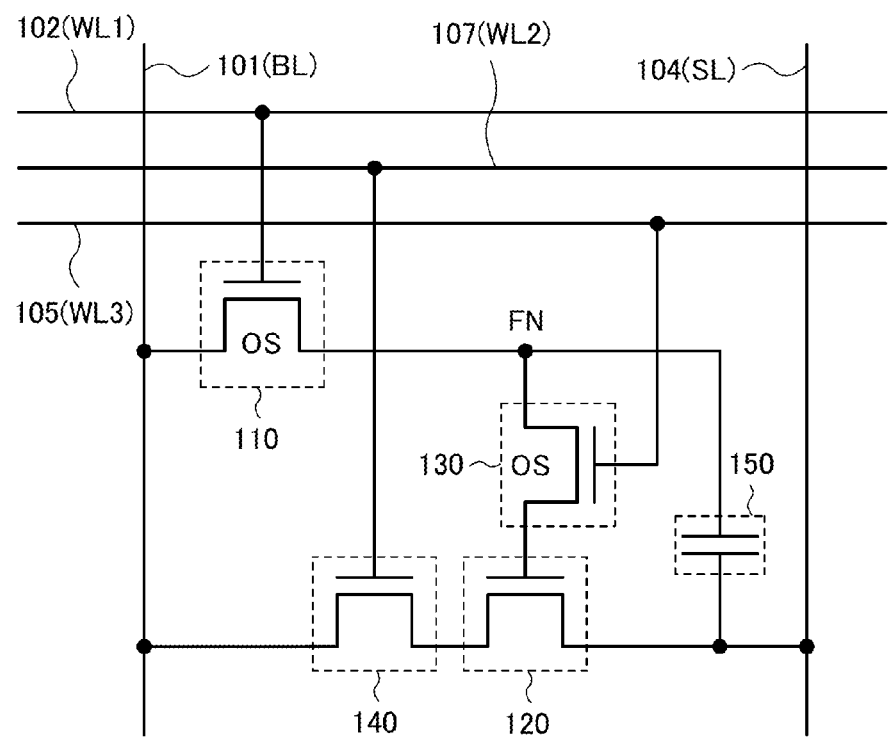
FIG. 5 is a circuit diagram of a semiconductor device.

FIG. 5 is a circuit diagram illustrating a specific connection state of the semiconductor device illustrated in FIG. 1, the fourth transistor 140 that operates as a read selection switch, and wirings.

The functions of the wirings are similar to those in the circuit diagram in FIG. 3. The fifth wiring 105 can serve as a word line (WL3) for writing and reading data. In the circuit diagram illustrated in FIG. 5, the first wiring 101 also serves as the third wiring 103 illustrated in FIG. 1, and the fourth wiring 104 also serves as the sixth wiring 106.

Figure 6:
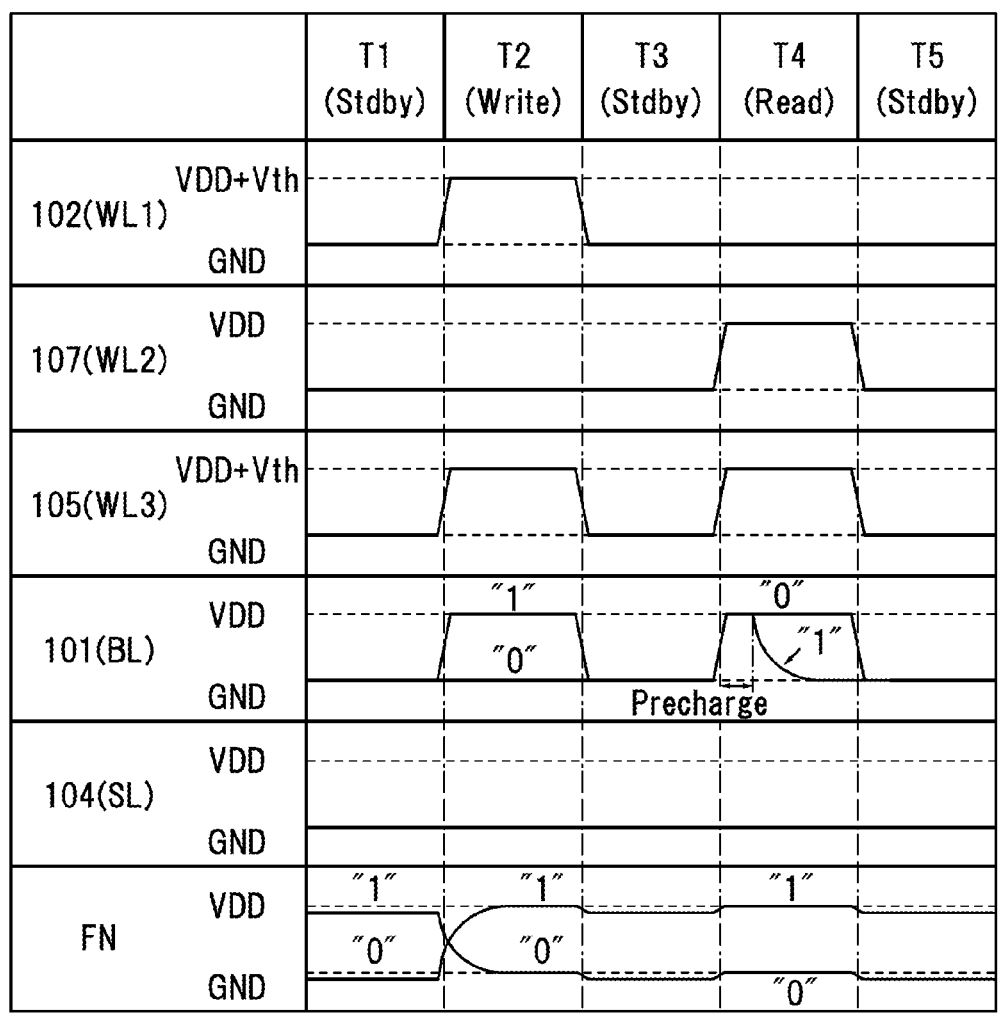
FIG. 6 is a timing chart showing operation of a semiconductor device.

FIG. 6 is an example of a timing chart showing operation of a semiconductor device constructed according to the circuit diagram in FIG. 5. In FIG. 6, the potentials of wirings and the node FN are shown.

First, the potential of the node FN is either "1" or "0" in the standby period T1. The potential of the fourth wiring 104 (SL) is normally low (for example, GND).

Next, in the writing period T2, the potential of the first wiring 101 (BL) is set to "1" or "0", the potential of the second wiring 102 (WL1) is set to higher than or equal to a high potential (for example, VDD+the threshold voltage of the first transistor 110) so that the first transistor 110 is turned on, and the potential of the fifth wiring 105 (WL3) is set to higher than or equal to a high potential (for example, VDD+the threshold voltage of the third transistor 130) so that the third transistor 130 is turned on, whereby "1" or "0" is written to the node FN. Note that a data potential can also be written without the operation for turning on the third transistor 130.

In the standby period T3 after the writing period T2, the potential of the fifth wiring 105 (WL3) is set to low (for example, GND) so that the third transistor 130 is turned off, whereby the connection between the node FN and the second transistor 120 is cut. Like the first transistor 110, the third transistor 130 is a transistor that is formed using an oxide semiconductor and that has an extremely low off-state current; thus, the potential of the node FN can be held even in the case where the gate leakage current ($I_G$) of the second transistor 120 is high.

In an early stage of the reading period T4 after the standby period T3, the potential of the first wiring 101 (BL) is precharged to a high potential (for example, VDD), the potential of the fifth wiring 105 (WL3) is set to a high potential to turn on the third transistor 130, and the potential of the seventh wiring 107 is set to a high potential to turn on the fourth transistor 140. At that time, the potential of the first wiring 101 (BL) is changed in accordance with the potential of the node FN; thus, data of "1" or "0" can be accurately read.

Note that in the case where the gate leakage current ($I_G$) of the second transistor 120 is high in the early stage of the reading period T4, the potential of the node FN might be lowered owing to the gate capacitance of the second transistor 120; however, when the capacitance of the capacitor 150 is sufficient large, the effect of the lowered potential of the node FN is negligible, which permits data to be accurately read. In the case of applications in which only reading operation is frequently performed, writing operation may be performed at regular intervals.

Figure 7A:
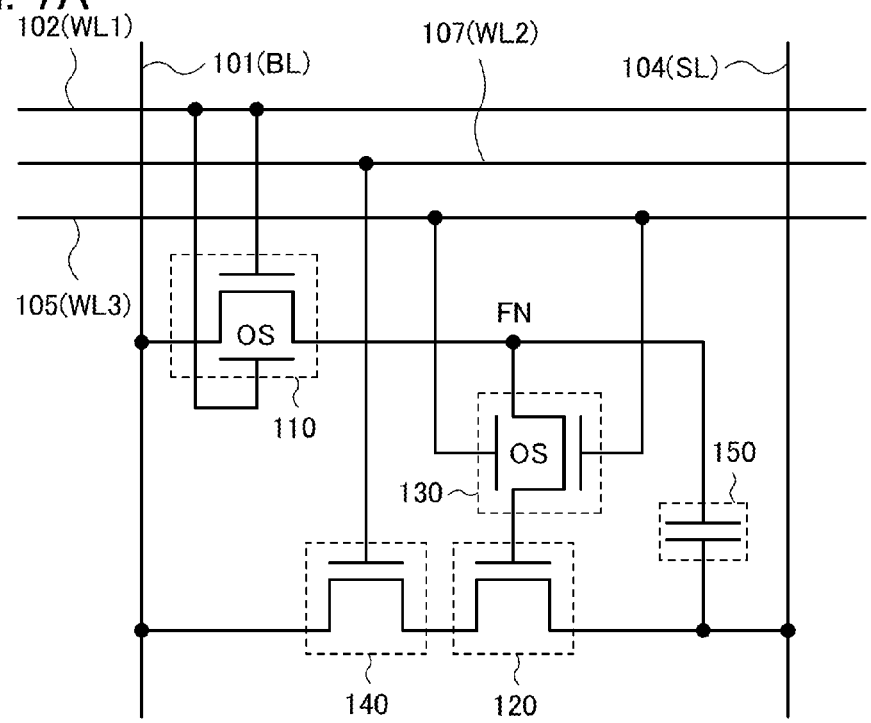
FIGS. 7A and 7B are circuit diagrams of semiconductor devices.
Figure 7B:
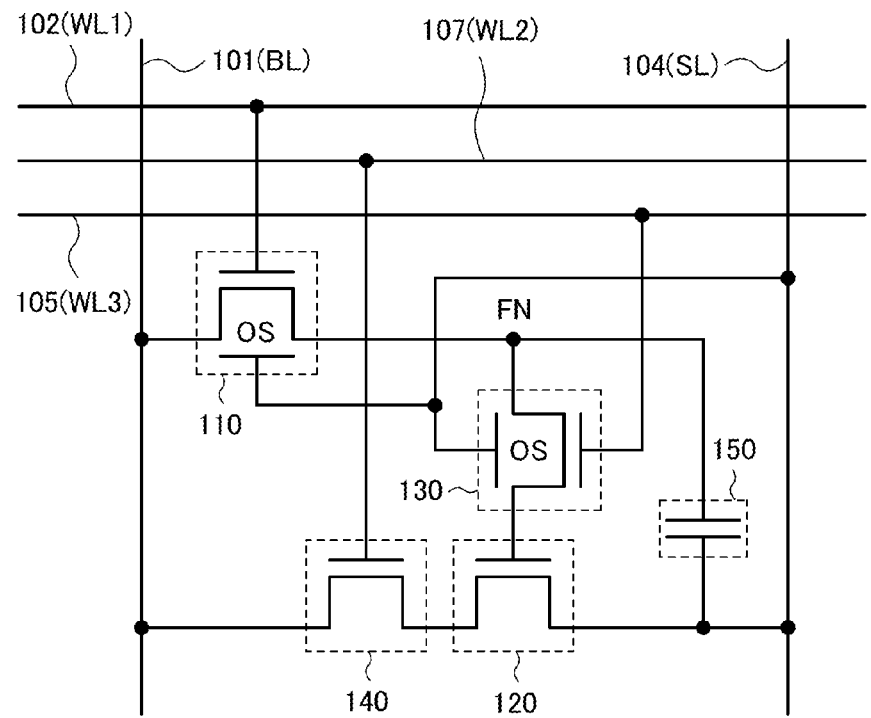

Furthermore, in the semiconductor device of one embodiment of the present invention, the first transistor 110 and the third transistor 130 may each be provided with a back gate as illustrated in FIGS. 7A and 7B. FIG. 7A illustrates a structure where the same potential is supplied to a front gate and a back gate, and this structure enables an increase in on-state current. FIG. 7B illustrates a structure where a constant potential is supplied to a back gate, and this structure enables the threshold voltage to be controlled. Although the back gate is electrically connected to the fourth wiring 104 (SL) in FIG. 7B, the back gate may be electrically connected to another wiring to which a constant potential is supplied.

Figure 8:
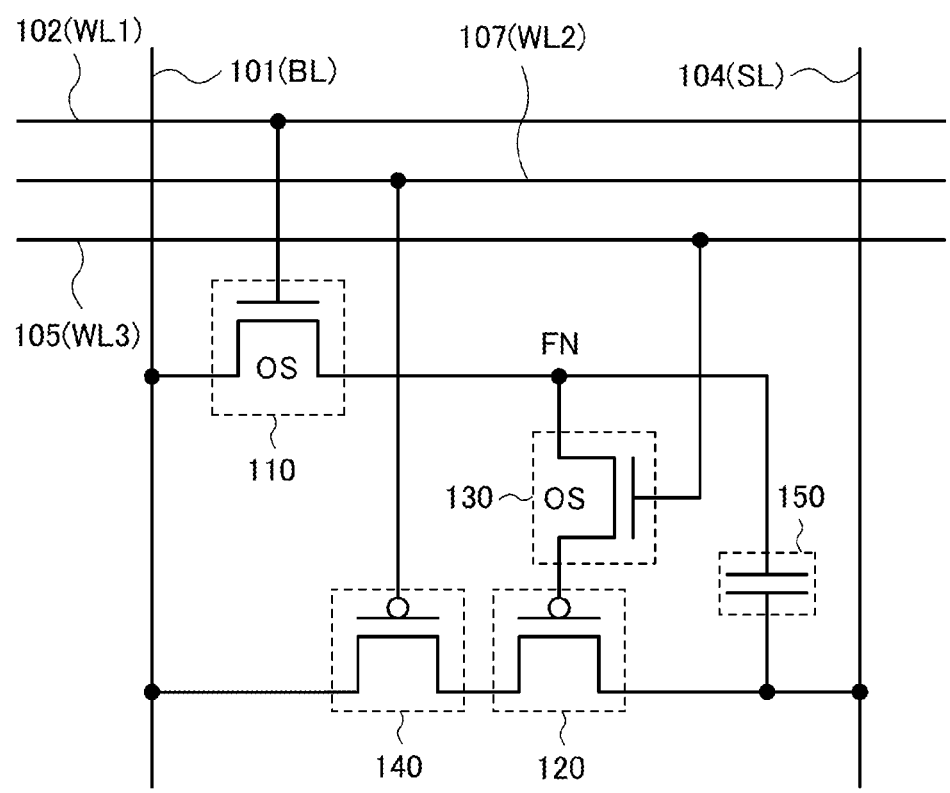
FIG. 8 is a circuit diagram of a semiconductor device.

All the transistors in the above description of the semiconductor device are assumed to be n-channel transistors but may be p-channel transistors. For example, the second transistor 120 and the fourth transistor 140 can be p-channel transistors as illustrated in FIG. 8. It is needless to say that a combination of the configuration of FIG. 8 and any of the configurations in FIGS. 7A and 7B may be employed. The specific structure of the semiconductor device, such as the material used for the semiconductor device and the structure of the semiconductor device, is not necessarily limited to those described here except for the use of the transistor formed using an oxide semiconductor for holding data.

This embodiment can be combined with any of the other embodiments in this specification as appropriate.

Embodiment 2

In this embodiment, transistors that can be used as the first transistor 110 and the third transistor 130 described in Embodiment 1 will be described with reference to drawings.

Figure 9A:
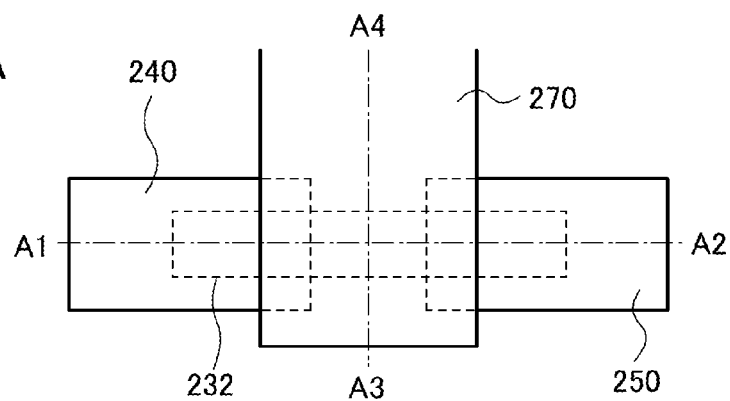
FIGS. 9A to 9C are a top view and cross-sectional views illustrating a transistor.
Figure 9B:
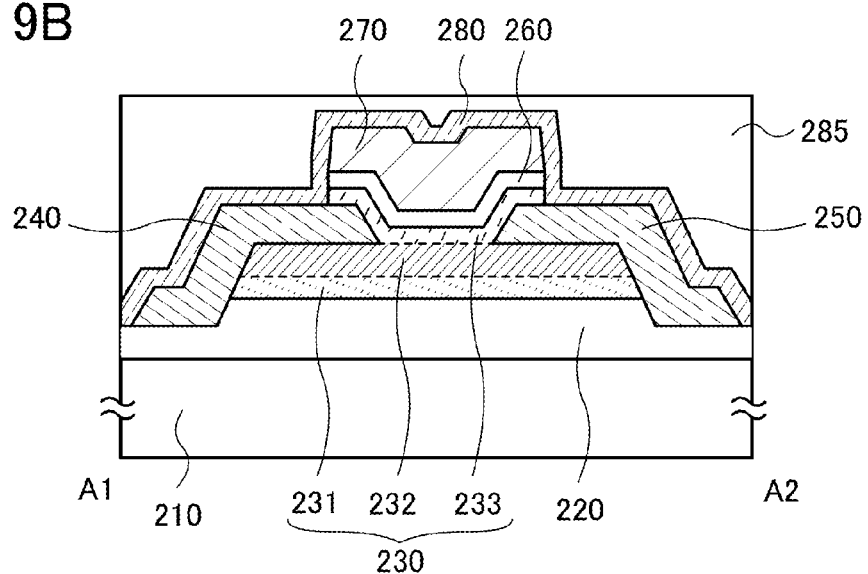
Figure 9C:
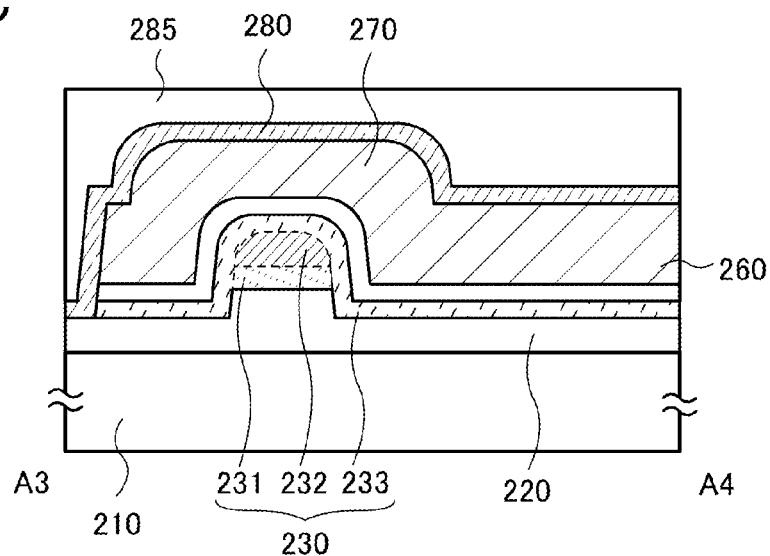

FIGS. 9A to 9C are a top view and cross-sectional views of the transistor. FIG. 9A is the top view, and FIG. 9B illustrates a cross section along dashed-dotted line A1-A2 in FIG. 9A. FIG. 9C is a cross-sectional view along dashed-dotted line A3-A4 in FIG. 9A. Note that for simplification, some components are not illustrated in the top view in FIG. 9A. The direction of the dashed-dotted line A1-A2 may be referred to as the channel length direction, and the direction of the dashed-dotted line A3-A4 may be referred to as the channel width direction.

A transistor illustrated in FIGS. 9A to 9C includes a base insulating film 220 formed over a substrate 210; a stack in which a first oxide semiconductor layer 231 and a second oxide semiconductor layer 232 are provided in this order formed over the base insulating film; a source electrode layer 240 and a drain electrode layer 250 each of which is formed in contact with part of the stack; a third oxide semiconductor layer 233 which is in contact with part of each of the base insulating film 220, the stack, the source electrode layer 240, and the drain electrode layer 250; a gate insulating film 260 formed over the third oxide semiconductor layer 233; a gate electrode layer 270 formed over the gate insulating film 260; and an insulating layer 280 formed over the source electrode layer 240, the drain electrode layer 250, and the gate electrode layer 270.

Note that functions of a "source" and a "drain" of a transistor are sometimes replaced with each other when a transistor of opposite polarity is used or when the direction of current flow is changed in circuit operation, for example. Therefore, the terms "source" and "drain" can be used to denote the drain and the source, respectively, in this specification.

The first oxide semiconductor layer 231 preferably includes a crystalline layer in which c-axes are aligned in the direction perpendicular to a surface of the base insulating film 220. The second oxide semiconductor layer 232 preferably includes a crystalline layer in which c-axes are aligned in the direction perpendicular to the top surface of the first oxide semiconductor layer 231.

Furthermore, the third oxide semiconductor layer 233 preferably includes a crystalline layer in which c-axes are aligned in the direction perpendicular to a surface of the stack.

An insulating layer 285 formed using an oxide may be formed over the insulating layer 280. The insulating layer 285 may be provided as needed and another insulating layer may be further provided thereover. The first oxide semiconductor layer 231, the second oxide semiconductor layer 232, and the third oxide semiconductor layer 233 are collectively referred to as an oxide semiconductor layer 230.

Next, the components of the transistor illustrated in FIGS. 9A to 9C will be described in detail.

The substrate 210 is not limited to a simple supporting substrate, and may be a substrate where a device such as a transistor is formed. In that case, at least one of the gate electrode layer 270, the source electrode layer 240, and the drain electrode layer 250 of the transistor may be electrically connected to the device.

The base insulating film 220 can have a function of supplying oxygen to the oxide semiconductor layer 230 as well as a function of preventing diffusion of impurities from the substrate 210. For this reason, the base insulating film 220 is preferably an insulating film containing oxygen, more preferably an insulating film in which the oxygen content is higher than that in the stoichiometric composition. In the case where the substrate 210 is a substrate where a device is formed as described above, the base insulating film 220 also serves as an interlayer insulating film. In that case, the base insulating film 220 is preferably subjected to planarization treatment such as chemical mechanical polishing (CMP) treatment so as to have a flat surface.

In a region where a channel of the transistor is formed, the oxide semiconductor layer 230 has a structure in which the first oxide semiconductor layer 231, the second oxide semiconductor layer 232, and the third oxide semiconductor layer 233 are stacked in this order from the substrate 210 side. In addition, as illustrated in the cross-sectional view in the channel width direction in FIG. 9C, in the channel formation region, the third oxide semiconductor layer 233 is formed to cover a side surface, the top surface, and the opposite side surface of the stack including the first oxide semiconductor layer 231 and the second oxide semiconductor layer 232. This means that, in the channel formation region, the second oxide semiconductor layer 232 is surrounded by the first oxide semiconductor layer 231 and the third oxide semiconductor layer 233.

Here, for the second oxide semiconductor layer 232, for example, an oxide semiconductor whose electron affinity (an energy difference between a vacuum level and the bottom of the conduction band) is higher than those of the first oxide semiconductor layer 231 and the third oxide semiconductor layer 233 is used. The electron affinity can be obtained by subtracting an energy difference between the bottom of a conduction band and the top of a valence band (what is called an energy gap) from an energy difference between the vacuum level and the top of the valence band (what is called an ionization potential).

Figure 10A:
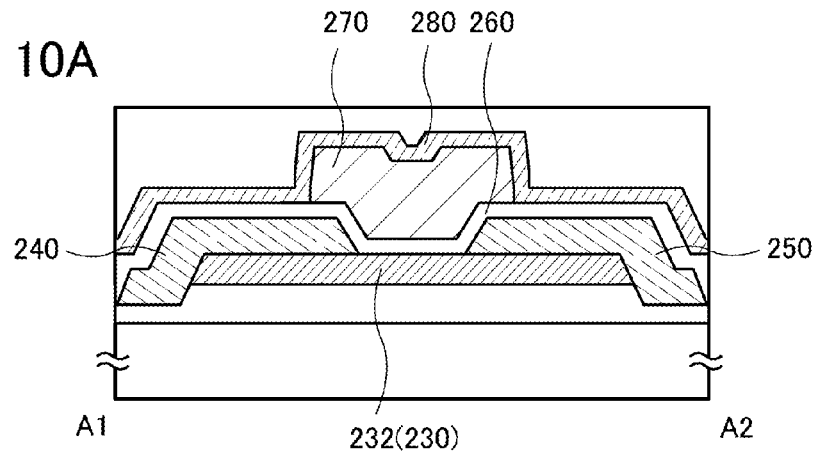
FIGS. 10A to 10C are cross-sectional views illustrating transistors.
Figure 10B:
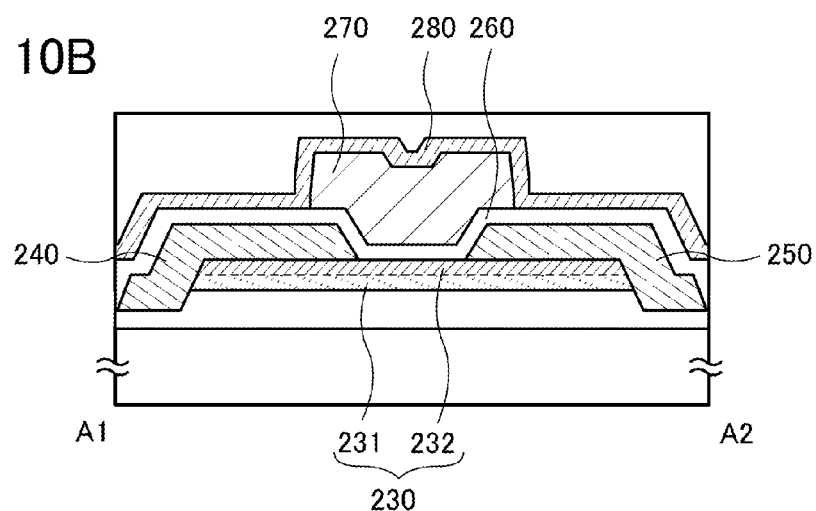
Figure 10C:
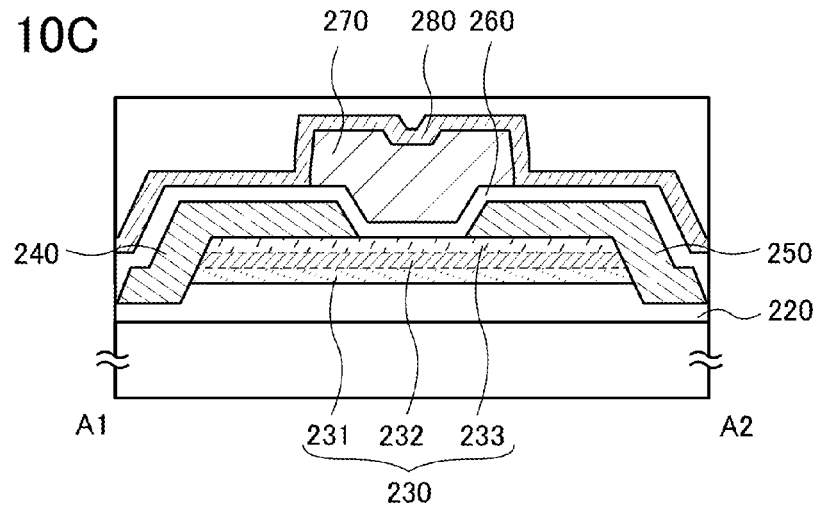

Although the case where the oxide semiconductor layer 230 is a stack of three layers is described in detail in this embodiment, the oxide semiconductor layer 230 may be a single layer or a stack of two layers or four or more layers. In the case where the oxide semiconductor layer 230 is a single layer, for example, a structure illustrated in FIG. 10A can be employed and a layer corresponding to the second oxide semiconductor layer 232 is used. In the case where the oxide semiconductor layer 230 is a stack of two layers, for example, a structure without the third oxide semiconductor layer 233 is employed as illustrated in FIG. 10B. In such a case, the second oxide semiconductor layer 232 and the first oxide semiconductor layer 231 can be interchanged. In the case where the oxide semiconductor layer 230 is a stack of three layers, a structure different from that in FIGS. 9A to 9C, such as that in FIG. 10C, can be employed. In the case of a layered structure of four or more layers, for example, a structure in which another oxide semiconductor layer is stacked over the three-layer stack described in this embodiment or a structure in which another oxide semiconductor layer is inserted in any one of the interfaces in the three-layer stack can be employed.

The first oxide semiconductor layer 231 and the third oxide semiconductor layer 233 each contain one or more kinds of metal elements contained in the second oxide semiconductor layer 232. For example, the first oxide semiconductor layer 231 and the third oxide semiconductor layer 233 are preferably formed using an oxide semiconductor whose energy of the bottom of the conduction band is closer to a vacuum level than that of the second oxide semiconductor layer 232 is, by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode layer 270, a channel is formed in the second oxide semiconductor layer 232 whose energy of the bottom of the conduction band is the lowest in the oxide semiconductor layer 230. In other words, the third oxide semiconductor layer 233 is formed between the second oxide semiconductor layer 232 and the gate insulating film 260, whereby a structure in which the channel of the transistor is not in contact with the gate insulating film is obtained.

Since the first oxide semiconductor layer 231 contains one or more metal elements contained in the second oxide semiconductor layer 232, an interface state is less likely to be formed at the interface of the second oxide semiconductor layer 232 with the first oxide semiconductor layer 231 than at the interface with the base insulating film 220 when the second oxide semiconductor layer 232 is in contact with the base insulating film 220. The interface sometimes forms a channel when the interface state is formed; therefore, the threshold voltage of the transistor fluctuates in some cases. Thus, providing the first oxide semiconductor layer 231 leads to reduction in fluctuations of the electric characteristics of the transistors, such as a threshold voltage. Furthermore, the reliability of the transistor can be improved.

Since the third oxide semiconductor layer 233 contains one or more metal elements contained in the second oxide semiconductor layer 232, scattering of carriers is less likely to occur at the interface of the second oxide semiconductor layer 232 with the third oxide semiconductor layer 233 than at the interface with the gate insulating film 260 when the second oxide semiconductor layer 232 is in contact with the gate insulating film 260. Therefore, providing the third oxide semiconductor layer 233 leads to an increase in the field-effect mobility of the transistor.

For the first oxide semiconductor layer 231 and the third oxide semiconductor layer 233, for example, a material containing Al, Ti, Ga, Ge, Y, Zr, Sn, La, Ce, or Hf at a higher atomic ratio than that used for the second oxide semiconductor layer 232 can be used. Specifically, the atomic ratio of any of the above metal elements in the first oxide semiconductor layer 231 and the third oxide semiconductor layer 233 is 1.5 times or more, preferably 2 times or more, more preferably 3 times or more as much as that in the second oxide semiconductor layer 232. Any of the above metal elements is strongly bonded to oxygen and thus has a function of inhibiting generation of an oxygen vacancy in the oxide semiconductor layer. That is, an oxygen vacancy is less likely to be generated in the first oxide semiconductor layer 231 and the third oxide semiconductor layer 233 than in the second oxide semiconductor layer 232.

Note that when each of the first oxide semiconductor layer 231, the second oxide semiconductor layer 232, and the third oxide semiconductor layer 233 is an In-M-Zn oxide containing at least indium, zinc, and M (M is a metal such as Al, Ti, Ga, Ge, Y, Zr, Sn, La, Ce, or Hf), and the first oxide semiconductor layer 231 has an atomic ratio of In to M and Zn which is $x_1:y_1:z_1$, the second oxide semiconductor layer 232 has an atomic ratio of In to M and Zn which is $x_2:y_2:z_2$, and the third oxide semiconductor layer 233 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more as large as $y_2/x_2$, preferably 2 times or more as large as $y_2/x_2$, more preferably 3 times or more as large as $y_2/x_2$. In that case, when $y_2$ is larger than or equal to $x_2$ in the second oxide semiconductor layer 232, the transistor can have stable electric characteristics. However, when $y_2$ is 3 times or more as large as $x_2$, the field-effect mobility of the transistor is reduced; accordingly, $y_2$ is preferably smaller than 3 times $x_2$.

Note that in this specification, an atomic ratio used for describing the composition of an oxide semiconductor layer is also used as the atomic ratio of a base material. In the case where an oxide semiconductor layer is deposited by a sputtering method using an oxide semiconductor material as a target, the composition of the oxide semiconductor layer might be different from that of the target, which is a base material, depending on the kind or the ratio of a sputtering gas, the density of the target, or deposition conditions. Thus, in this specification, an atomic ratio used for describing the composition of an oxide semiconductor layer is also used as the atomic ratio of a base material. For example, in the case where a sputtering method is used for deposition, an In—Ga—Zn oxide film whose atomic ratio of In to Ga and Zn is 1:1:1 can be also understood as an In—Ga—Zn oxide film formed using an In—Ga—Zn oxide material whose atomic ratio of In to Ga and Zn is 1:1:1 as a target.

In the case where Zn and O are not taken into consideration, the proportion of In and the proportion of M in each of the first oxide semiconductor layer 231 and the third oxide semiconductor layer 233 are preferably less than 50 atomic % and greater than or equal to 50 atomic %, respectively, and more preferably less than 25 atomic % and greater than or equal to 75 atomic %, respectively. In addition, in the case where Zn and O are not taken into consideration, the proportion of In and the proportion of M in the second oxide semiconductor layer 232 are preferably greater than or equal to 25 atomic % and less than 75 atomic %, respectively, and more preferably greater than or equal to 34 atomic % and less than 66 atomic %, respectively.

The thicknesses of the first oxide semiconductor layer 231 and the third oxide semiconductor layer 233 are each greater than or equal to 1 nm and less than or equal to 100 nm, preferably greater than or equal to 3 nm and less than or equal to 50 nm. The thickness of the second oxide semiconductor layer 232 is greater than or equal to 1 nm and less than or equal to 200 nm, preferably greater than or equal to 3 nm and less than or equal to 100 nm, more preferably greater than or equal to 3 nm and less than or equal to 50 nm.

Thus, when the oxide semiconductor layer 230 has a layered structure including the first oxide semiconductor layer 231, the second oxide semiconductor layer 232, and the third oxide semiconductor layer 233, a channel can be formed in the second oxide semiconductor layer 232, so that the transistor can have a high field-effect mobility and stable electric characteristics.

In a band structure, energies of the bottoms of the conduction bands of the first oxide semiconductor layer 231, the second oxide semiconductor layer 232, and the third oxide semiconductor layer 233 are continuously changed. This can be understood also from the fact that the compositions of the first oxide semiconductor layer 231, the second oxide semiconductor layer 232, and the third oxide semiconductor layer 233 are close to one another and oxygen is easily diffused. Thus, the first oxide semiconductor layer 231, the second oxide semiconductor layer 232, and the third oxide semiconductor layer 233 have a continuous physical property although they have different compositions and form a stack. In the drawings, interfaces between the oxide semiconductor layers of the stack are indicated by dotted lines.

Note that the oxide semiconductor layer 230 in which layers containing the same main components are stacked is not formed by simply stacking layers but is formed to have a continuous energy band (here, in particular, a well structure having a U shape in which energies of the bottoms of the conduction bands are changed continuously between layers). In other words, the layered structure is formed so that there exists no impurities that forms a defect level such as a trap center or a recombination center at each interface. If an impurity exists between the stacked oxide semiconductor layers, continuity of the energy band is lost, and thus carriers are trapped or disappear by recombination at the interface.

For example, an In—Ga—Zn oxide whose atomic ratio of In to Ga and Zn is 1:3:2, 1:3:3, 1:3:4, 1:3:6, 1:6:4, or 1:9:6 can be used for the first oxide semiconductor layer 231 and the third oxide semiconductor layer 233, and an In—Ga—Zn oxide whose atomic ratio of In to Ga and Zn is 1:1:1, 5:5:6, or 3:1:2 can be used for the second oxide semiconductor layer 232.

The second oxide semiconductor layer 232 in the oxide semiconductor layer 230 forms a well and a channel is formed in the second oxide semiconductor layer 232 in the transistor including the oxide semiconductor layer 230. Note that since the energies of the bottoms of the conduction bands are changed continuously in the oxide semiconductor layer 230, the oxide semiconductor layer 230 can also be referred to as a U-shaped well. Further, a channel with such a structure can also be referred to as a buried channel.

Note that trap levels due to impurities or defects might be formed in the vicinity of the interface between an insulating film such as a silicon oxide film and each of the first oxide semiconductor layer 231 and the third oxide semiconductor layer 233. The second oxide semiconductor layer 232 can be kept away from the trap levels owing to existence of the first oxide semiconductor layer 231 and the third oxide semiconductor layer 233.

However, when the energy difference between the energy of the bottom of the conduction band of the second oxide semiconductor layer 232 and the energy of the bottom of the conduction band of each of the first oxide semiconductor layer 231 and the third oxide semiconductor layer 233 is small, electrons in the second oxide semiconductor layer 232 might reach the trap level by passing over the energy difference. When the electrons are captured by the trap level, negative fixed charge is generated at the interface with the insulating film, whereby the threshold voltage of the transistor shifts in the positive direction.

Thus, to reduce fluctuations in the threshold voltage of the transistor, an energy difference of at least a certain value between the bottom of the conduction band of the second oxide semiconductor layer 232 and the bottom of the conduction band of each of the first oxide semiconductor layer 231 and the third oxide semiconductor layer 233 is necessary. Each of the energy differences is preferably greater than or equal to 0.1 eV, more preferably greater than or equal to 0.15 eV.

Note that stable electric characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1 \times 10^{17}/cm^3$, preferably lower than $1 \times 10^{15}/cm^3$, more preferably lower than $1 \times 10^{13}/cm^3$.

In the oxide semiconductor layer, hydrogen, nitrogen, carbon, silicon, and metal elements except main components are impurities. For example, hydrogen and nitrogen form donor levels to increase the carrier density, and silicon forms impurity levels in the oxide semiconductor layer. The impurity levels serve as traps and might cause the electric characteristics of the transistor to deteriorate. Therefore, it is preferable to reduce the concentration of the impurities in the first oxide semiconductor layer 231, the second oxide semiconductor layer 232, and the third oxide semiconductor layer 233 and at interfaces between the layers.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is preferably lower than $1 \times 10^{19}$ atoms/$cm^3$, more preferably lower than $5 \times 10^{18}$ atoms/cm$^3$, still more preferably lower than 1×10$^{18}$ atoms/cm$^3$. Furthermore, the concentration of hydrogen at a certain depth of the oxide semiconductor layer or in a region of the oxide semiconductor layer is preferably lower than or equal to 2×10$^{20}$ atoms/cm$^3$, more preferably lower than or equal to 5×10$^{19}$ atoms/cm$^3$, still more preferably lower than or equal to 1×10$^{19}$ atoms/cm$^3$, yet still more preferably lower than or equal to 5×10$^{18}$ atoms/cm$^3$. Furthermore, the concentration of nitrogen at a certain depth of the oxide semiconductor layer or in a region of the oxide semiconductor layer is preferably lower than 5×10$^{19}$ atoms/cm$^3$, more preferably lower than or equal to 5×10$^{18}$ atoms/cm$^3$, still more preferably lower than or equal to 1×10$^{18}$ atoms/cm$^3$, yet still more preferably lower than or equal to 5×10$^{17}$ atoms/cm$^3$.

In the case where the oxide semiconductor layer includes crystals, a high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than 1×10$^{19}$ atoms/cm$^3$, preferably lower than 5×10$^{18}$ atoms/cm$^3$, more preferably lower than 1×10$^{18}$ atoms/cm$^3$. Furthermore, the concentration of carbon at a certain depth of the oxide semiconductor layer or in a region of the oxide semiconductor layer may be lower than 1×10$^{19}$ atoms/cm$^3$, preferably lower than 5×10$^{18}$ atoms/cm$^3$, more preferably lower than 1×10$^{18}$ atoms/cm$^3$, for example.

A transistor including a highly purified oxide semiconductor film used for a channel formation region as described above has an extremely low off-state current. In the case where the voltage between a source and a drain is set to approximately 0.1 V, 5 V, or 10 V, for example, the off-state current standardized on the channel width of the transistor can be as low as several yoctoamperes per micrometer to several zeptoamperes per micrometer.

Note that as a gate insulating film of the transistor, an insulating film containing silicon is used in many cases; thus, it is preferable that, as in the transistor of one embodiment of the present invention, a region that serves as a channel of the oxide semiconductor layer be not in contact with the gate insulating film for the above reason. In the case where a channel is formed at the interface between a gate insulating film and an oxide semiconductor layer, scattering of carriers might occur at the interface, reducing the field-effect mobility of the transistor. Also in view of the above, it is preferable that a region that serves as a channel of an oxide semiconductor layer be separated from a gate insulating film.

For the source electrode layer 240 and the drain electrode layer 250, a conductive material that is easily bonded to oxygen is preferably used. For example, Al, Cr, Cu, Ta, Ti, Mo, or W can be used. Among the materials, it is particularly preferable to use Ti, which is easily bonded to oxygen, or W with a high melting point, which allows subsequent process temperatures to be relatively high. Note that the conductive material that is easily bonded to oxygen includes, in its category, a material to which oxygen is easily diffused.

When the conductive material that is easily bonded to oxygen is in contact with an oxide semiconductor layer, a phenomenon occurs in which oxygen in the oxide semiconductor layer is diffused to the conductive material that is easily bonded to oxygen. The phenomenon noticeably occurs when the temperature is high. Since the manufacturing process of the transistor includes a heat treatment step, the above phenomenon causes generation of oxygen vacancies in the vicinity of a region that is in the oxide semiconductor layer and is in contact with the source electrode layer or the drain electrode layer. The oxygen vacancies are bonded to hydrogen slightly contained in the film, whereby the region is changed into an n-type region. Accordingly, the n-type region can serve as a source or a drain of the transistor.

In the case of forming a transistor with an extremely short channel length, the n-type region formed by the generation of the oxygen vacancies might extend in the channel length direction of the transistor. In that case, the electric characteristics of the transistor change; for example, the threshold voltage is shifted, or on/off of the transistor is hard to control with the gate voltage (in which case the transistor is turned on). Accordingly, when a transistor with an extremely short channel length is formed, it is not always preferable that a conductive material that is easily bonded to oxygen be used for a source electrode layer and a drain electrode layer.

In such a case, a conductive material that is less likely to be bonded to oxygen than the above material is can be used for the source electrode layer 240 and the drain electrode layer 250. As the conductive material, for example, a material containing tantalum nitride, titanium nitride, gold, platinum, palladium, or ruthenium or the like can be used. Alternatively, the source electrode layer 240 and the drain electrode layer 250 may each have a structure where the conductive material that is less likely to be bonded to oxygen and the above conductive material that is likely to be bonded to oxygen are stacked.

The gate insulating film 260 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 260 may be a stack of any of the above materials.

For the gate electrode layer 270, a conductive film formed using Al, Ti, Cr, Co, Ni, Cu, Y, Zr, Mo, Ru, Ag, Ta, W, or the like can be used. The gate electrode layer may be a stack of any of the above materials. Alternatively, a conductive film containing nitrogen may be used for the gate electrode layer.

The insulating layer 280 is preferably formed over the gate insulating film 260 and the gate electrode layer 270. The insulating layer is preferably formed using aluminum oxide. The aluminum oxide film has a high blocking effect of preventing penetration of both oxygen and impurities such as hydrogen and moisture. Accordingly, during and after the manufacturing process of the transistor, the aluminum oxide film can be suitably used as a protective film that prevents entry of impurities such as hydrogen and moisture, which causes variations in the electric characteristics of the transistor, into the oxide semiconductor layer 230, release of oxygen, which is a main component material of the oxide semiconductor layer 230, from the oxide semiconductor layer, and unnecessary release of oxygen from the base insulating film 220.

The insulating layer 285 is preferably formed over the insulating layer 280. The insulating layer 285 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating layer may be a stack of any of the above materials.

Here, the insulating layer 285 preferably contains excess oxygen. The oxide insulating layer containing excess oxygen means an oxide insulating layer from which oxygen can be released by heat treatment or the like. The oxide insulating layer containing excess oxygen is preferably a film in which the amount of released oxygen when converted into oxygen atoms is greater than or equal to $1.0\times10^{19}$ atoms/cm$^3$ in thermal desorption spectroscopy analysis. In the thermal desorption spectroscopy analysis, heat treatment is performed at a substrate temperature in the range from 100° C. to 700° C., preferably from 100° C. to 500° C. Oxygen released from the oxide insulating layer can be diffused to the channel formation region in the oxide semiconductor layer 230 through the gate insulating film 260, so that oxygen vacancies formed in the channel formation region can be filled with the oxygen. Thus, stable electric characteristics of the transistor can be achieved.

High integration of a semiconductor device requires miniaturization of a transistor. However, it is known that miniaturization of a transistor causes degradation of the electric characteristics of the transistor. When a channel width is decreased, the on-state current becomes low.

However, in the transistor of one embodiment of the present invention, as described above, the third oxide semiconductor layer 233 is formed so as to cover the channel formation region of the second oxide semiconductor layer 232, and the channel formation layer and the gate insulating film are not in contact with each other. Accordingly, scattering of carriers at the interface between the channel formation layer and the gate insulating film can be reduced, increasing the field-effect mobility of the transistor.

Figure 11:
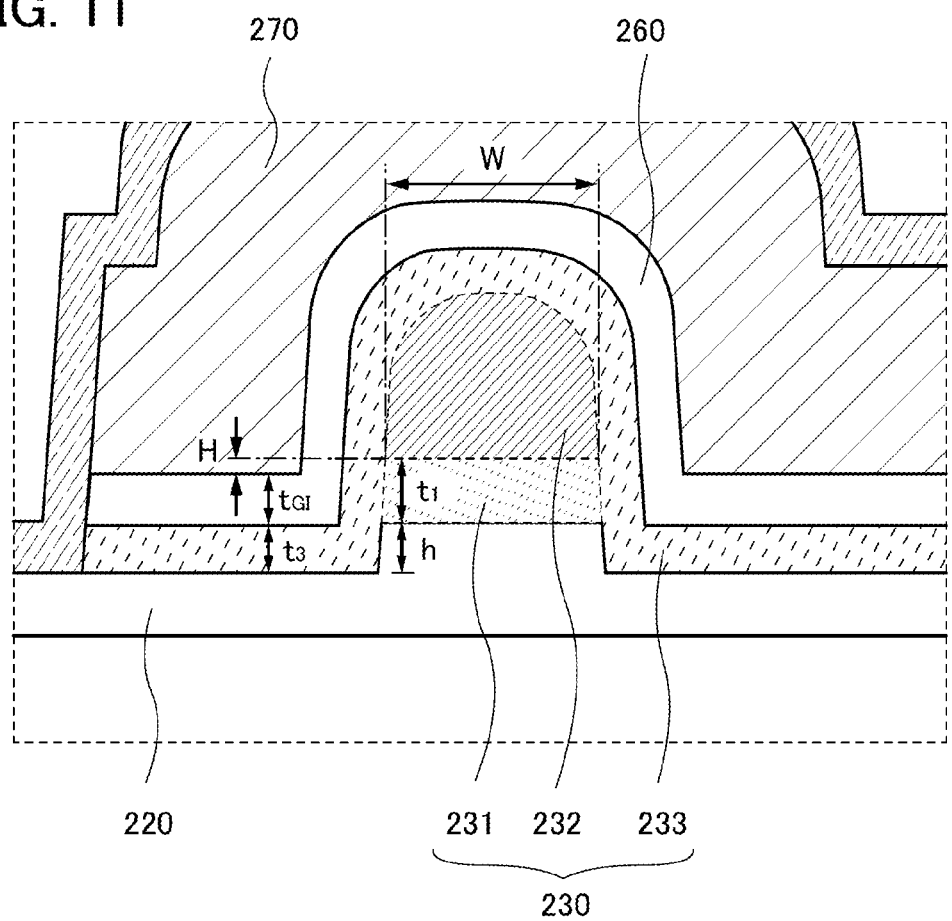
FIG. 11 is a cross-sectional view illustrating a transistor.

In addition, the electric characteristics of the transistor of one embodiment of the present invention can be particularly improved with such a structure as illustrated in a cross-sectional view in the channel width direction in FIG. 11, in which the length of the top surface (W) of the second oxide semiconductor layer 232 in the channel width direction is as small as or smaller than its thickness.

When the height of a projection of the base insulating film 220 is h, the thickness of the first oxide semiconductor layer 231 is $t_1$, the thickness of the third oxide semiconductor layer 233 is $t_3$, and the thickness of the gate insulating film 260 is $t_{GI}$, a distance H, a difference between (h+$t_1$) and ($t_3$+$t_{GI}$), is greater than 0, preferably 5% or more and less than 300% of W, more preferably 10% or more and less than 300% of W. Furthermore, the distance H is preferably less than W, more preferably less than the thickness $t_1$ of the first oxide semiconductor layer 231.

With such a structure, an electric field is applied to the whole second oxide semiconductor layer 232 from the gate electrode layer 270 because the gate electrode layer 270 surrounds the second oxide semiconductor layer 232; accordingly, the on-state current can be increased. Such a transistor structure is referred to as a surrounded channel (s-channel) structure. In the s-channel structure, a current can flow through the whole second oxide semiconductor layer 232. Since a current flows through the second oxide semiconductor layer 232, an adverse effect of interface scattering is unlikely to occur, leading to a high on-state current. Increasing the thickness of the second oxide semiconductor layer 232 can further increase the on-state current.

Thus, the transistor of one embodiment of the present invention has a sufficiently high on-state current even when miniaturized.

In the transistor of one embodiment of the present invention, the second oxide semiconductor layer 232 is formed over the first oxide semiconductor layer 231, so that an interface state is less likely to be formed. In addition, impurities do not enter the second oxide semiconductor layer 232 from above and below because the second oxide semiconductor layer 232 is an intermediate layer in the three-layer structure. Accordingly, not only can the on-state current of the transistor be increased but also the threshold voltage can be stabilized and the S value can be reduced. Thus, Icut (current when gate voltage VG is 0 V) can be reduced and power consumption of the semiconductor device can be reduced. Furthermore, the threshold voltage of the transistor becomes stable; thus, long-term reliability of the semiconductor device can be improved.

Figure 12A:
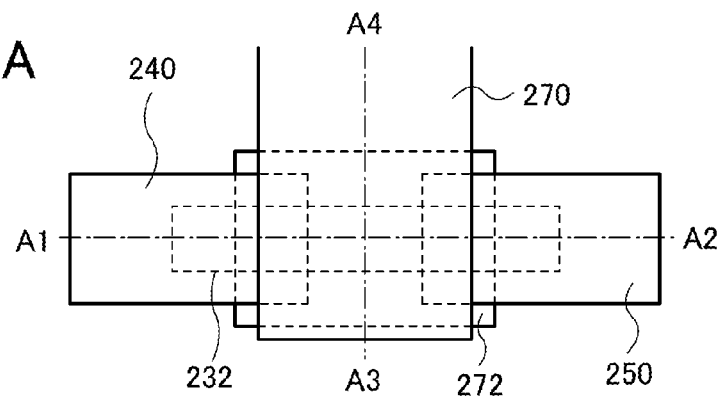
FIGS. 12A to 12C are a top view and cross-sectional views illustrating a transistor.
Figure 12B:
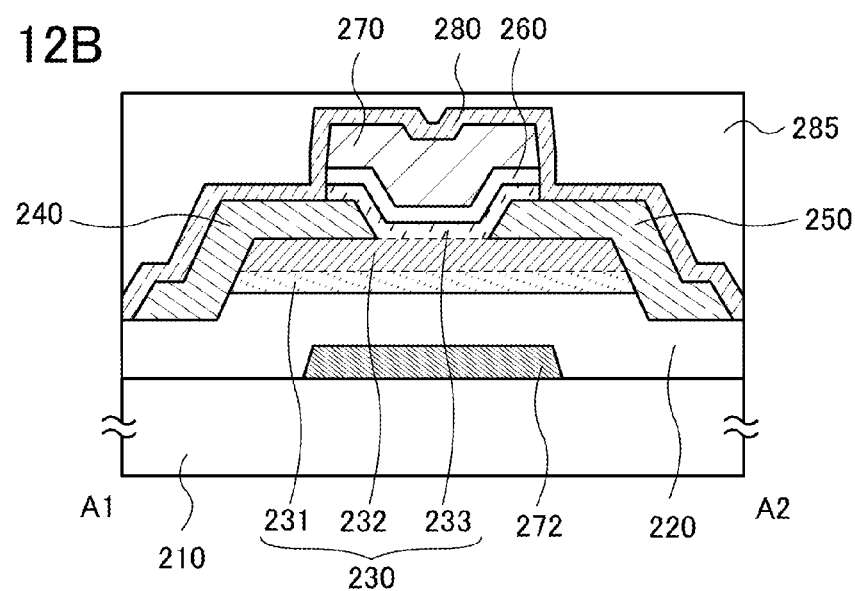
Figure 12C:
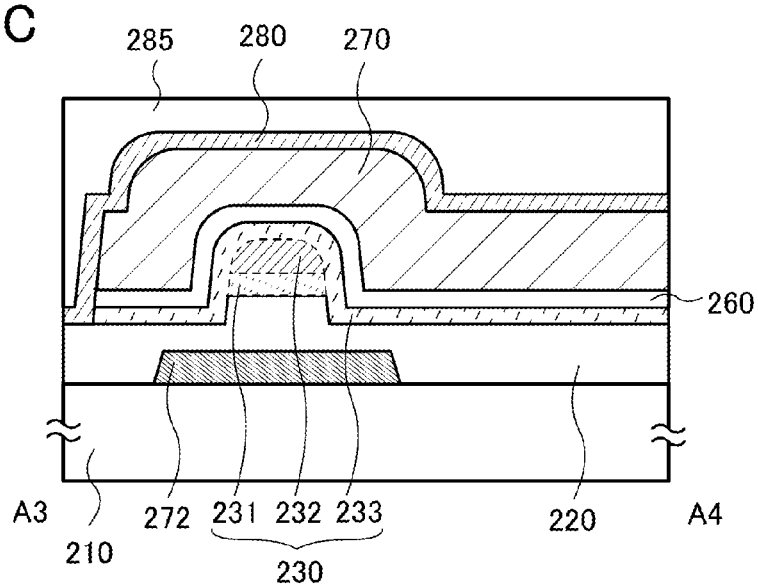

The transistor of one embodiment of the present invention may include a conductive film 272 between the oxide semiconductor layer 230 and the substrate 210 as illustrated in FIGS. 12A to 12C. When the conductive film is used as a second gate electrode (back gate), the on-state current can be further increased and the threshold voltage can be controlled. In order to increase the on-state current, for example, the gate electrode layer 270 and the conductive film 272 are set to have the same potential, and the transistor is driven as a dual-gate transistor. To control the threshold voltage, a fixed potential, which is different from a potential of the gate electrode layer 270, is supplied to the conductive film 272. Note that a wiring for supplying a potential to the conductive film 272, a connection portion, and the like are not illustrated.

This embodiment can be combined with any of the other embodiments in this specification as appropriate.

Embodiment 3

In this embodiment, a method for fabricating the transistor described in Embodiment 2 with reference to FIGS. 9A to 9C will be described with reference to FIGS. 13A to 13C and FIGS. 14A to 14C.

As the substrate 210, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

The base insulating film 220 can be formed by a plasma CVD method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a film in which any of the above materials are mixed. Alternatively, a stack including any of the above materials may be used, and at least an upper layer of the base insulating film 220 that is in contact with the oxide semiconductor layer 230 is preferably formed using a material containing excess oxygen that might serve as a supply source of oxygen to the oxide semiconductor layer 230.

Oxygen may be added to the base insulating film 220 by an ion implantation method, an ion doping method, a plasma immersion ion implantation method, or the like. Adding oxygen enables the base insulating film 220 to supply oxygen more easily to the oxide semiconductor layer 230.

In the case where the surface of the substrate 210 is made of an insulator and there is no influence of impurity diffusion to the oxide semiconductor layer 230 to be formed later, the base insulating film 220 is not necessarily provided.

Figure 13A:
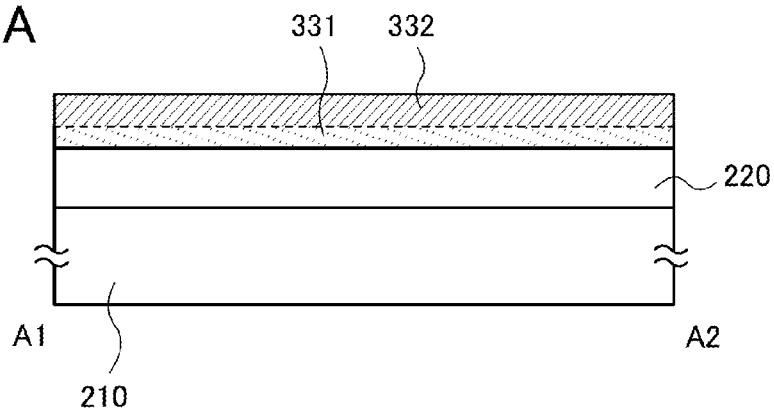
FIGS. 13A to 13C illustrate a method for fabricating a transistor.

Next, a first oxide semiconductor film 331 to be the first oxide semiconductor layer 231 and a second oxide semiconductor film 332 to be the second oxide semiconductor layer 232 are deposited over the base insulating film 220 by a sputtering method, a CVD method, an MBE method, an ALD method, or a PLD method (see FIG. 13A).

Figure 13B:
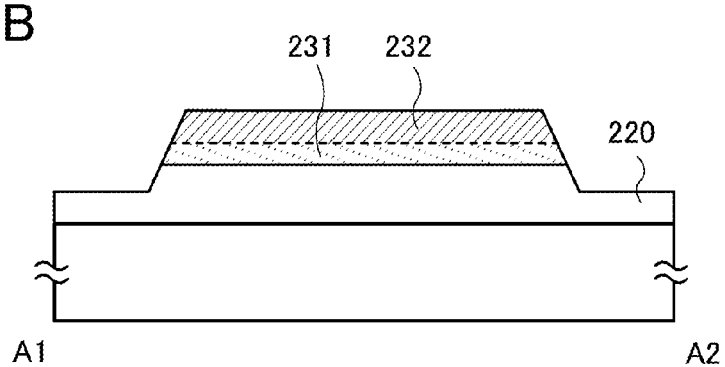

Subsequently, the first oxide semiconductor film 331 and the second oxide semiconductor film 332 are selectively etched to form the first oxide semiconductor layer 231 and the second oxide semiconductor layer 232 (see FIG. 13B). At this time, the base insulating film 220 may also be etched slightly as illustrated in FIG. 13B. The slightly etched base insulating film 220 enables the second oxide semiconductor layer 232 to be easily covered by a gate electrode that is formed later. Further, the second oxide semiconductor layer 232 is formed to have a curvature from its top surface to its side surface in the cross section in the channel width direction of the transistor.

Note that when the first oxide semiconductor film 331 and the second oxide semiconductor film 332 are selectively etched, not only a photoresist but also a hard mask such as a metal film can be used. In addition, an organic resin may be formed over the metal film. As the metal film, for example, a tungsten film with a thickness of approximately 5 nm can be used.

For the etching, dry etching in which a difference between the etching rate of the first oxide semiconductor film 331 and that of the second oxide semiconductor film 332 is small is preferably used.

In order to form a continuous energy band in a stack including the first oxide semiconductor layer 231 and the second oxide semiconductor layer 232, the layers are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to approximately $5\times10^{-7}$ Pa to $1\times10^{-4}$ Pa) by an adsorption vacuum pump such as a cryopump and that the chamber be able to heat a substrate over which a film is to be deposited to 100° C. or higher, preferably 500° C. or higher so that water and the like as impurities are removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation in a chamber but also high purity of a sputtering gas is necessary to obtain a high-purity intrinsic oxide semiconductor. When a highly purified gas having a dew point of −40° C. or lower, preferably −80° C. or lower, more preferably −100° C. or lower is used as an oxygen gas or an argon gas used as a sputtering gas, moisture or the like can be prevented from entering the oxide semiconductor film as much as possible.

For the first oxide semiconductor layer 231, the second oxide semiconductor layer 232, and the third oxide semiconductor layer 233 formed in a later step, any of the materials described in Embodiment 2 can be used.

An oxide semiconductor that can be used for each of the first oxide semiconductor layer 231, the second oxide semiconductor layer 232, and the third oxide semiconductor layer 233 preferably contains at least indium (In) or zinc (Zn). Alternatively, both In and Zn are preferably contained. In order to reduce fluctuations in electric characteristics of the transistor including the oxide semiconductor, the oxide semiconductor preferably contains a stabilizer in addition to In and Zn.

Examples of the stabilizer include gallium (Ga), tin (Sn), hafnium (Hf), aluminum (Al), and zirconium (Zr). Other examples of the stabilizer include lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: an indium oxide, a tin oxide, a zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an "In—Ga—Zn oxide" means an oxide containing In, Ga, and Zn as its main components. The In—Ga—Z-based oxide may contain another metal element in addition to In, Ga, and Zn. Further, in this specification, a film formed using an In—Ga—Zn oxide is also referred to as an IGZO film.

Alternatively, a material represented by $InMO_3(ZnO)_m$ (m>0, m is not an integer) may be used. Note that M represents one or more metal elements selected from Ga, Y, Zr, La, Ce, and Nd. Alternatively, a material represented by $In_2SnO_5(ZnO)_n$ (n>0, n is an integer) may be used.

Note that as described in Embodiment 2 in detail, a material of the second oxide semiconductor layer 232 is selected so that the second oxide semiconductor layer 232 has an electron affinity higher than that of the first oxide semiconductor layer 231 and that of the third oxide semiconductor layer 233.

Note that the oxide semiconductor film is preferably formed by a sputtering method. As the sputtering method, an RF sputtering method, a DC sputtering method, an AC sputtering method, or the like can be used.

In the case where an In—Ga—Zn oxide is used for the first oxide semiconductor layer 231, the second oxide semiconductor layer 232, or the third oxide semiconductor layer 233, a material whose atomic ratio of In to Ga and Zn is any of 1:1:1, 2:2:1, 2:2:3, 3:1:2, 5:5:6, 1:3:2, 1:3:3, 1:3:4, 1:3:6, 1:4:3, 1:5:4, 1:6:6, 2:1:3, 1:6:4, 1:9:6, 1:1:4, and 1:1:2 can be used.

Note that for example, the expression "the composition of an oxide containing In, Ga, and Zn at the atomic ratio of In:Ga:Zn=a:b:c (a+b+c=1) is in the neighborhood of the composition of an oxide containing In, Ga, and Zn at the atomic ratio of In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The indium content of the second oxide semiconductor layer 232 is preferably higher than those of the first oxide semiconductor layer 231 and the third oxide semiconductor layer 233. In an oxide semiconductor, the s orbital of heavy metal mainly contributes to carrier transfer, and as the proportion of In in the oxide semiconductor is increased, overlap of the s orbitals is increased. Therefore, an oxide having a composition in which the proportion of In is higher than that of Ga has higher mobility than an oxide having a composition in which the proportion of In is equal to or lower than that of Ga. Thus, the use of an oxide having a high indium content for the second oxide semiconductor layer 232 enables fabrication of a transistor having high mobility.

A structure of an oxide semiconductor film will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, reduction in electron mobility due to the grain boundary is less likely to occur.

According to the TEM image of the CAAC-OS film observed in the direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film.

On the other hand, according to the TEM image of the CAAC-OS film observed in the direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in the direction substantially perpendicular to the formation surface or the top surface of the CAAC-OS film.

On the other hand, when the CAAC-OS film is analyzed by an in-plane method in which an X-ray enters a sample in the direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in the direction parallel to a normal vector of the formation surface or a normal vector of the top surface of the CAAC-OS film. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in the direction parallel to a normal vector of the formation surface or a normal vector of the top surface of the CAAC-OS film. Thus, for example, in the case where a shape of the CAAC-OS film is changed by etching or the like, the c-axis of the crystal might not be necessarily parallel to a normal vector of the formation surface or a normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having a low impurity concentration. The impurity is an element other than the main components of the oxide semiconductor film, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, heavy metals such as iron and nickel, argon, carbon dioxide, and the like each have a large atomic radius (molecular radius), and thus disturb the atomic arrangement of the oxide semiconductor film and causes a decrease in crystallinity when any of them is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, oxygen vacancies in the oxide semiconductor film serve as carrier traps or serve as carrier generation sources in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electric characteristics and high reliability. Charge trapped by the carrier traps in the oxide semiconductor film takes a long time to be released, and might behave like fixed charge. Thus, a transistor including an oxide semiconductor film having a high impurity concentration and a high density of defect states has unstable electric characteristics in some cases.

In a transistor using the CAAC-OS film, change in electric characteristics due to irradiation with visible light or ultraviolet light is small.

Next, a microcrystalline oxide semiconductor film will be described.

In an image obtained with TEM, crystal parts cannot be found clearly in the microcrystalline oxide semiconductor film in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm or a size greater than or equal to 1 nm and less than or equal to 3 nm is specifically referred to as nanocrystal (nc). An oxide semiconductor film including a nanocrystal is referred to as a nanocrystalline oxide semiconductor (nc-OS) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film which is obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film having more regularity than the amorphous oxide semiconductor film; thus, the nc-OS film has a lower density of defect levels than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stack including two or more films of an amorphous oxide semiconductor film, a microcrystalline oxide semiconductor film, and a CAAC-OS film, for example.

For example, a CAAC-OS film can be deposited by a sputtering method using a polycrystalline oxide semiconductor sputtering target. When ions collide with the sputtering target, a crystal region included in the sputtering target may be separated from the target along an a-b plane; in other words, flat-plate-like or pellet-like sputtered particles each having a plane parallel to an a-b plane may flake off from the sputtering target. In that case, the flat-plate-like or pellet-like sputtered particles are electrically charged and thus are not aggregated in plasma. They reach a substrate while maintaining its crystal state, whereby the CAAC-OS film can be formed over the substrate.

In the case where the second oxide semiconductor layer 232 is formed using an In-M-Zn oxide (M is Ga, Y, Zr, La, Ce, or Nd) and a sputtering target whose atomic ratio of In to M and Zn is a1:b1:c1 is used to form the second oxide semiconductor layer 232, a1/b1 is preferably greater than or equal to ⅓ and less than or equal to 6, more preferably greater than or equal to 1 and less than or equal to 6, and c1/b1 is preferably greater than or equal to ⅓ and less than or equal to 6, more preferably greater than or equal to 1 and less than or equal to 6. Note that when c1/b1 is greater than or equal to 1 and less than or equal to 6, a CAAC-OS film is easily formed as the second oxide semiconductor layer 232. Typical examples of the atomic ratio of In to M and Zn of the target are 1:1:1, 3:1:2, and 5:5:6.

In the case where the first oxide semiconductor layer 231 and the third oxide semiconductor layer 233 are each formed using an In-M-Zn oxide (M is Ga, Y, Zr, La, Ce, or Nd) and a sputtering target whose atomic ratio of In to M and Zn is a2:b2:c2 is used to form the first oxide semiconductor layer 231 and the third oxide semiconductor layer 233, a2/b2 is preferably less than a1/b1, and c2/b2 is preferably greater than or equal to ⅓ and less than or equal to 6, more preferably greater than or equal to 1 and less than or equal to 6. Note that when c2/b2 is greater than or equal to 1 and less than or equal to 6, CAAC-OS films are easily formed as the first oxide semiconductor layer 231 and the third oxide semiconductor layer 233. Typical examples of the atomic ratio of In to M and Zn of the target are 2:3:2, 2:3:3, 2:3:4, and 2:3:6.

First heat treatment may be performed after the second oxide semiconductor layer 232 is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the second oxide semiconductor layer 232 can be improved, and in addition, impurities such as hydrogen and water can be removed from the base insulating film 220 and the first oxide semiconductor layer 231. Note that the first heat treatment may be performed before etching for formation of the second oxide semiconductor layer 232.

Next, a first conductive film to be the source electrode layer 240 and the drain electrode layer 250 is formed over the first oxide semiconductor layer 231 and the second oxide semiconductor layer 232. For the first conductive film, Al, Cr, Cu, Ta, Ti, Mo, W, or an alloy material containing any of these as its main component can be used. For example, a 100-nm-thick titanium film is formed by a sputtering method or the like. Alternatively, a tungsten film may be formed by a CVD method.

Figure 13C:
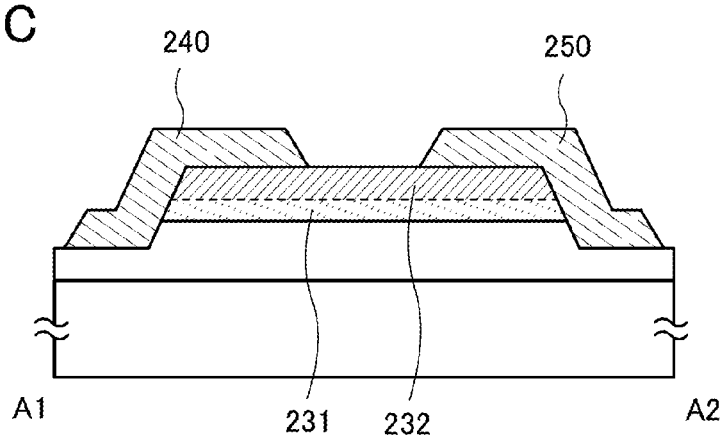

Next, the first conductive film is etched so as to be divided over the second oxide semiconductor layer 232 to form the source electrode layer 240 and the drain electrode layer 250 (see FIG. 13C). At this time, the first conductive film may be over-etched so that the second oxide semiconductor layer 232 is partly etched.

Subsequently, a third oxide semiconductor film 333 to be the third oxide semiconductor layer 233 is formed over the first oxide semiconductor layer 231, the second oxide semiconductor layer 232, the source electrode layer 240, and the drain electrode layer 250. In the third oxide semiconductor film 333, a microcrystalline layer is formed in the vicinity of the interface with the second oxide semiconductor layer 232, and a crystalline layer in which c-axes are aligned is formed over the microcrystalline layer.

Note that second heat treatment may be performed after the third oxide semiconductor film 333 is formed. The second heat treatment can be performed under the condition similar to that of the first heat treatment. The second heat treatment can remove impurities such as hydrogen and water from the third oxide semiconductor film 333, the first oxide semiconductor layer 231, and the second oxide semiconductor layer 232.

Next, an insulating film 360 to be the gate insulating film 260 is formed over the third oxide semiconductor film 333. The insulating film 360 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The insulating film 360 may be a stack including any of the above materials. The insulating film 360 can be formed by a sputtering method, a CVD method, an MBE method, an ALD method, a PLD method, or the like.

Figure 14A:
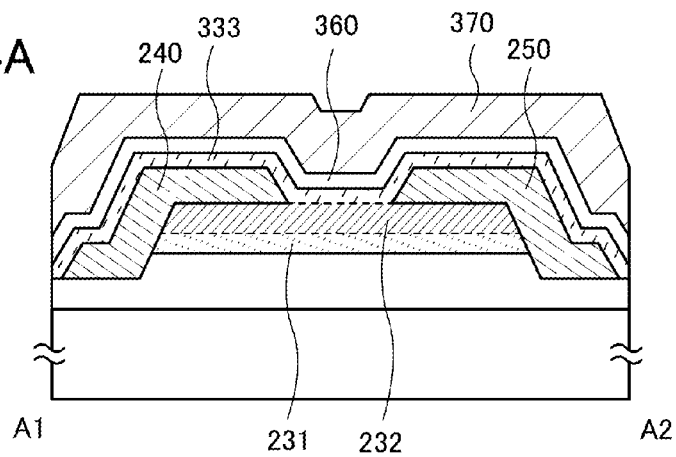
FIGS. 14A to 14C illustrate a method for fabricating a transistor.

Then, a second conductive film 370 to be the gate electrode layer 270 is formed over the insulating film 360 (see FIG. 14A). For the second conductive film 370, Al, Ti, Cr, Co, Ni, Cu, Y, Zr, Mo, Ru, Ag, Ta, W, or an alloy material containing any of these as its main component can be used. The second conductive film 370 can be formed by a sputtering method, a CVD method, or the like. A stack including the above conductive film and a conductive film containing nitrogen, or a conductive film containing nitrogen may be used for the second conductive film 370.

After that, the second conductive film 370 is selectively etched using a resist mask to form the gate electrode layer 270.

Then, the insulating film 360 is selectively etched using the resist mask or the gate electrode layer 270 as a mask to form the gate insulating film 260.

Figure 14B:
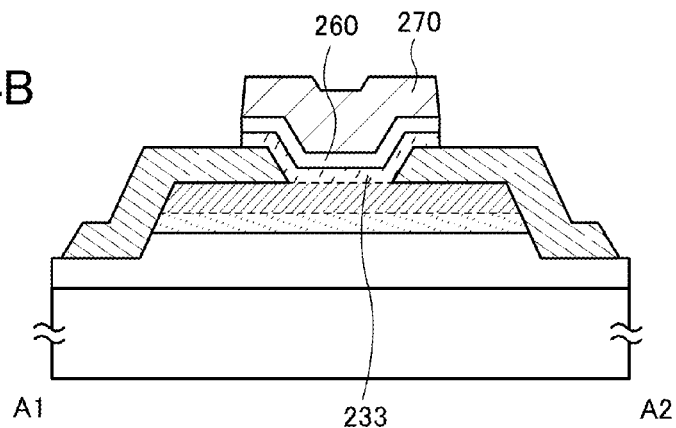

Subsequently, the third oxide semiconductor film 333 is etched using the resist mask or the gate electrode layer 270 as a mask to form the third oxide semiconductor layer 233 (see FIG. 14B).

The second conductive film 370, the insulating film 360, and the third oxide semiconductor film 333 may be etched individually or successively. Either dry etching or wet etching may be used as the etching method, and an appropriate etching method may be selected individually.

Figure 14C:
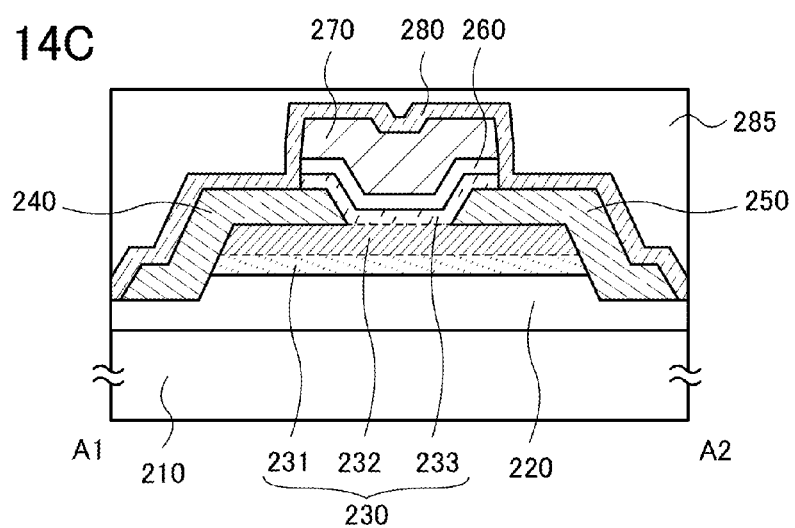

Next, the insulating layer 280 and the insulating layer 285 are formed over the source electrode layer 240, the drain electrode layer 250, and the gate electrode layer 270 (see FIG. 14C). The insulating layer 280 and the insulating layer 285 can each be formed using a material and a method which are similar to those of the base insulating film 220. Note that it is particularly preferable to use aluminum oxide for the insulating layer 280.

Oxygen may be added to the insulating layer 280 by an ion implantation method, an ion doping method, a plasma immersion ion implantation method, or the like. Adding oxygen enables the insulating layer 280 to supply oxygen much easily to the oxide semiconductor layer 230.

Next, third heat treatment may be performed. The third heat treatment can be performed under the condition similar to that of the first heat treatment. By the third heat treatment, excess oxygen is easily released from the base insulating film 220, the gate insulating film 260, and the insulating layer 280, so that oxygen vacancies in the oxide semiconductor layer 230 can be reduced.

Through the above steps, the transistor illustrated in FIGS. 9A to 9C can be fabricated.

Figure 15A:
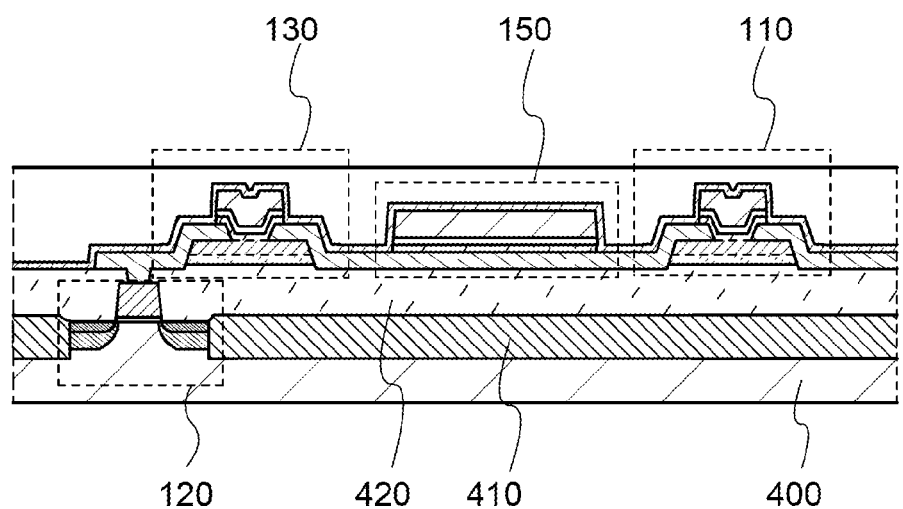
FIGS. 15A and 15B are cross-sectional views illustrating semiconductor devices.

FIG. 15A is an example of a cross section in which the transistor illustrated in FIGS. 9A to 9C is applied to the semiconductor device (FIG. 1) described in Embodiment 1.

The semiconductor device illustrated in FIG. 15A includes the first transistor 110 and the third transistor 130 that are formed using a first semiconductor material and the capacitor 150 in an upper portion and the second transistor 120 that is formed using a second semiconductor material in a lower portion.

The capacitor 150 can be formed in the same process as that of the first transistor 110 and the third transistor 130 when the capacitor 150 has a structure where one of electrodes is formed using the same material as that of the source electrode or the drain electrode of the transistor, the other electrode is formed using the same material as that of the gate electrode of the transistor, and the dielectric is formed using the same materials as those of the third oxide semiconductor layer and the gate insulating film of the transistor.

The first transistor 110 and the third transistor 130 are formed using an oxide semiconductor as described in Embodiment 1. The second transistor 120 includes a channel formation region provided in a substrate 400 including a semiconductor material (such as crystalline silicon), impurity regions provided such that the channel formation region is sandwiched therebetween, intermetallic compound regions provided in contact with the impurity regions, a gate insulating film provided over the channel formation region, and a gate electrode provided over the gate insulating film. Note that a transistor whose source electrode and drain electrode are not illustrated explicitly in a drawing may be referred to as a transistor for the sake of convenience. In such a case, in description of connection relation of a transistor, a source region and a source electrode are collectively referred to as a "source electrode", and a drain region and a drain electrode are collectively referred to as a "drain electrode". That is, in this specification, the term "source electrode" may mean a source region.

An element isolation insulating layer 410 is formed over the substrate 400 so as to surround the second transistor 120, and an insulating layer 420 is formed so as to cover the second transistor 120. Note that the element isolation insulating layer 410 can be formed by an element isolation technique such as local oxidation of silicon (LOCOS) or shallow trench isolation (STI).

For example, in the case where the substrate 400 is formed using a crystalline silicon substrate, the second transistor 120 can operate at high speed. Thus, when the transistor is used as a reading transistor, data can be read at high speed.

The first transistor 110 and the third transistor 130 are provided over the insulating layer 420. The one of the source electrode and the drain electrode of the first transistor 110 is electrically connected to the one of the source electrode and the drain electrode of the third transistor 130. The one of the source electrode and the drain electrode of the first transistor 110 and the one of the source electrode and the drain electrode of the third transistor 130 serve as the one electrode of the capacitor 150. The other of the source electrode and the drain electrode of the third transistor 130 is electrically connected to the gate electrode of the second transistor 120.

Figure 15B:
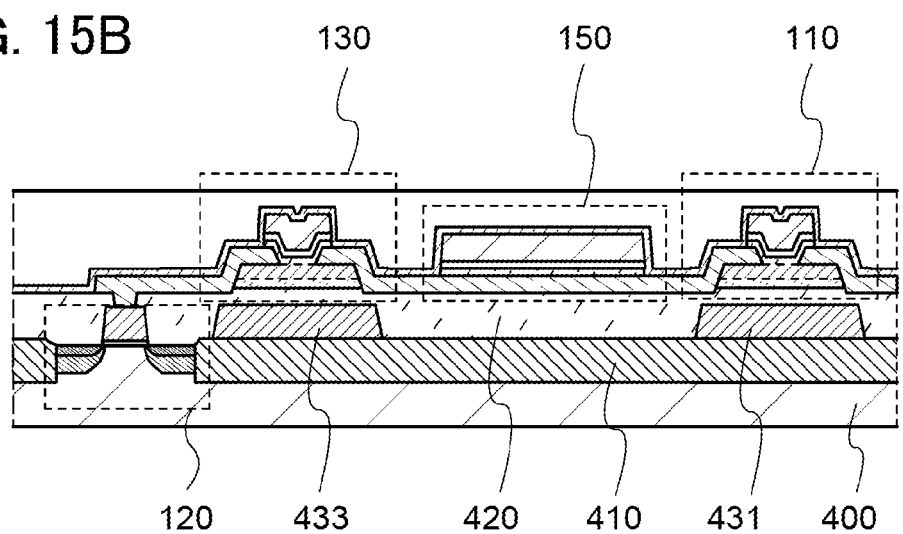

When an electrode 431 is provided so as to overlap with the first transistor 110 with the insulating layer 420 interposed therebetween and an electrode 433 is provided so as to overlap with the third transistor 130 with the insulating layer 420 interposed therebetween as illustrated in FIG. 15B, a semiconductor device including the transistor in FIGS. 12A to 12C can be constructed. The electrodes 431 and 433 can serve as back gates.

The first transistor 110 and the capacitor 150 can be formed over the substrate over which the second transistor 120 is formed as illustrated in FIGS. 15A and 15B, which enables the degree of the integration of the semiconductor device to be increased.

This embodiment can be combined with any of the other embodiments in this specification as appropriate.

Embodiment 4

In this embodiment, a CPU including the storage device described in Embodiment 1 will be described.

Figure 16:
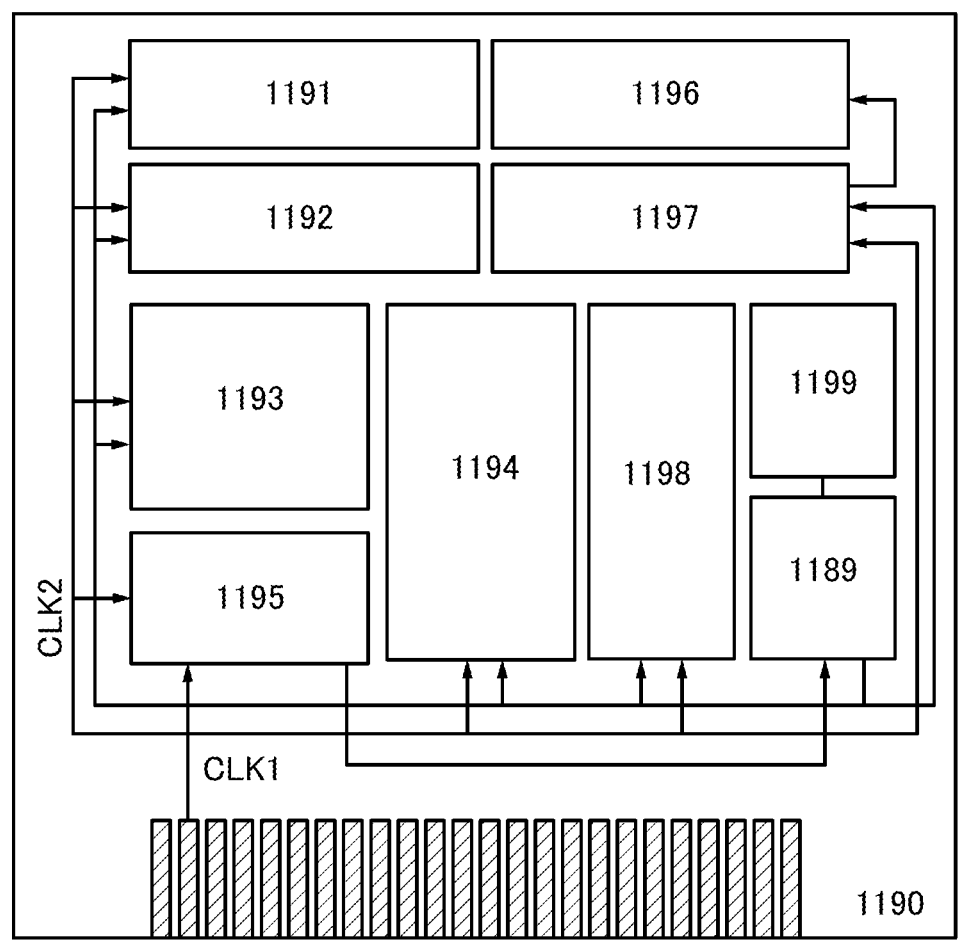
FIG. 16 is a block diagram of a semiconductor device.

FIG. 16 is a block diagram illustrating a configuration example of a CPU including the storage device described in Embodiment 1.

The CPU illustrated in FIG. 16 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189. A semiconductor substrate, an SOI substrate, a glass substrate, or the like is used as the substrate 1190. The ROM 1199 and the ROM interface 1189 may be provided in a separate chip. It is needless to say that the CPU in FIG. 16 is only an example in which the configuration is simplified, and actual CPUs have various configurations depending on applications. For example, the CPU may have the following configuration: a structure including the CPU illustrated in FIG. 16 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 16, a memory cell is provided in the register 1196. As the memory cell of the register 1196, the transistor described in the above embodiment can be used.

In the CPU in FIG. 16, the register controller 1197 selects operation of holding data in the register 1196, in response to an instruction from the ALU 1191. That is, the register controller 1197 determines whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of a power supply voltage to the memory cell in the register 1196 can be stopped.

Figure 17:
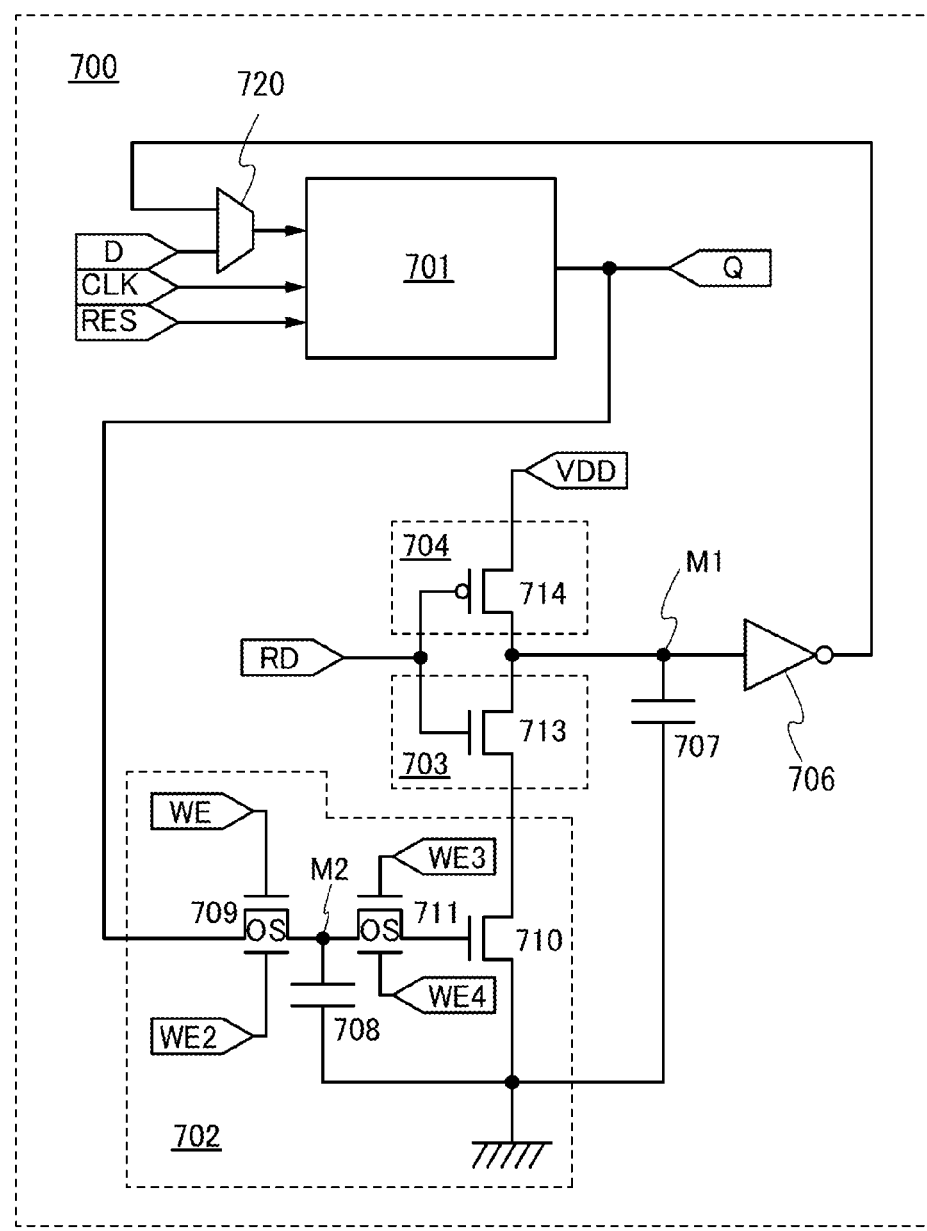
FIG. 17 is a circuit diagram illustrating a storage device.

FIG. 17 is an example of a circuit diagram of a storage element that can be used as the register 1196. A storage element 700 includes a circuit 701 in which stored data is erased when power supply is stopped, a circuit 702 in which stored data is not erased when power supply is stopped, a switch 703, a switch 704, a logic element 706, a capacitor 707, and a circuit 720 having a selecting function. The circuit 702 includes a capacitor 708, a transistor 709, a transistor 710, and a transistor 711. Note that the storage element 700 may further include another element such as a diode, a resistor, or an inductor, as needed.

Here, the storage device described in Embodiment 1 can be used as the circuit 702. When supply of the power supply voltage to the storage element 700 is stopped, a ground potential (0 V) or a potential at which the transistor 709 is turned off continues to be input to a gate of the transistor 709 in the circuit 702. For example, the gate of the transistor 709 is grounded through a load such as a resistor.

An example is described in which the switch 703 is a transistor 713 having one conductivity type (e.g., an n-channel transistor) and the switch 704 is a transistor 714 having a conductivity type opposite to the one conductivity type (e.g., a p-channel transistor). Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 and one of a source and a drain of the transistor 711 are electrically connected to one of a pair of electrodes of the capacitor 708. The other of the source and the drain of the transistor 711 is electrically connected to a gate of the transistor 710. Here, a connection portion of the transistors 709 and 711 and the capacitor 708 is referred to as a node M2. One of a source and a drain of the transistor 710 is electrically connected to a wiring that can supply a low power supply potential (e.g., a GND line), and the other thereof is electrically connected to the first terminal of the switch 703 (the one of the source and the drain of the transistor 713).

The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a wiring that can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to a wiring that can supply a low power supply potential (e.g., a GND line). The other of the pair of electrodes of the capacitor 708 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 708 is electrically connected to a wiring that can supply a low power supply potential (e.g., a GND line).

The capacitors 707 and 708 are not necessarily provided as long as the parasitic capacitance of the transistor, the wiring, or the like is actively utilized.

A control signal WE is input to a first gate (first gate electrode layer) of the transistor 709. A conducting state or a non-conducting state between the first terminal and the second terminal of each of the switches 703 and 704 is selected by the control signal RD, which is different from the control signal WE. When the first terminal and the second terminal of one of the switches are in the conducting state, the first terminal and the second terminal of the other of the switches are in the non-conducting state.

A signal corresponding to data held in the circuit 701 is input to the other of the source and the drain of the transistor 709. FIG. 17 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 17, a signal output from the second terminal of the switch 703 (the other of the source and the drain of the transistor 713) is input to the circuit 701 through the logic element 706 and the circuit 720; however, one embodiment of the present invention is not limited thereto. The signal output from the second terminal of the switch 703 (the other of the source and the drain of the transistor 713) may be input to the circuit 701 without its logic value inverted. For example, in the case where a node in which a signal obtained by inverting the logic value of a signal input from the input terminal is held is provided in the circuit 701, the signal output from the second terminal of the switch 703 (the other of the source and the drain of the transistor 713) can be input to the node.

The transistor 709 corresponds to the first transistor 110 in the semiconductor device described in Embodiment 1. Note that FIG. 17 illustrates a structure with a second gate (back gate). The control signal WE can be input to the first gate and the control signal WE2 can be input to the second gate. The control signal WE2 is a signal having a constant potential. As the constant potential, for example, a ground potential GND or a potential lower than the source potential of the transistor 709 is selected. The control signal WE2 is a potential signal for controlling the threshold voltage of the transistor 709, and Icut of the transistor 709 can be further reduced. The control signal WE2 may be a signal having the same potential as that of the control signal WE. Note that as the transistor 709, a transistor without a second gate may be used.

The transistor 711 corresponds to the third transistor 130 in the semiconductor device described in Embodiment 1. Note that FIG. 17 illustrates a structure with a second gate (back gate). A control signal WE3 can be input to the first gate and a control signal WE4 can be input to the second gate. The control signal WE4 is a signal having a constant potential. As the constant potential, for example, the ground potential GND or a potential lower than the source potential of the transistor 711 is selected. The control signal WE4 is a potential signal for controlling the threshold voltage of the transistor 711, and Icut of the transistor 711 can be further reduced. The control signal WE4 may be a signal having the same potential as that of the control signal WE3. Note that as the transistor 711, a transistor without a second gate may be used.

Further, in FIG. 17, the transistors included in the storage element 700 except for the transistors 709 and 711 can each be a transistor in which a channel is formed in a layer formed using a semiconductor other than an oxide semiconductor or in the substrate 1190. For example, a transistor whose channel is formed in a silicon layer or a silicon substrate as in the second transistor 120 described in Embodiment 1 can be used. Alternatively, a transistor in which a channel is formed in an oxide semiconductor layer can be used for all the transistors used for the storage element 700. Still alternatively, in the storage element 700, a transistor in which a channel is formed in an oxide semiconductor layer can be included besides the transistors 709 and 711, and a transistor in which a channel is formed in a layer or the substrate 1190 including a semiconductor other than an oxide semiconductor can be used for the rest of the transistors.

As the circuit 701 in FIG. 17, for example, a flip-flop circuit can be used. As the logic element 706, for example, an inverter, a clocked inverter, or the like can be used.

The semiconductor device of one embodiment of the present invention can, in a period during which the storage element 700 is not supplied with a power supply voltage, retain data stored in the circuit 701 by the capacitor 708 that is provided in the circuit 702.

The off-state current of a transistor in which a channel is formed in an oxide semiconductor layer is extremely low. For example, the off-state current of a transistor whose channel is formed in an oxide semiconductor layer is much lower than that of a transistor whose channel is formed in crystalline silicon. Thus, when such a transistor in which a channel is formed in an oxide semiconductor layer is used for the transistors 709 and 711, a signal held in the node M2 is held for a long time also in a period during which the power supply voltage is not supplied to the storage element 700. The storage element 700 can accordingly hold the stored content (data) also in a period during which the supply of a power supply voltage is stopped.

Since the switches 703 and 704 are provided, the storage element performs the precharge operation for the node M1; thus, the time required for the circuit 701 to hold original data again after the supply of a power supply voltage is resumed can be shortened.

In the circuit 702, a signal held by the capacitor 708 is input to the gate of the transistor 710. Therefore, after supply of a power supply voltage to the storage element 700 is resumed, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By applying the storage element 700 to a storage device such as a register or a cache memory included in a processor, data in the storage device can be prevented from being lost owing to the stop of the supply of a power supply voltage. Further, shortly after the supply of a power supply voltage is resumed, the storage element can be returned to the same state as that before the power supply is stopped. Therefore, the power supply can be stopped even for a short time in the processor or one or a plurality of logic circuits included in the processor. Accordingly, power consumption can be reduced.

Although an example in which the storage element 700 is used in a CPU is described in this embodiment, the storage element 700 can also be used in a digital signal processor (DSP), a custom LSI, an LSI such as a programmable logic device (PLD), and a radio frequency identification (RF-ID).

This embodiment can be combined with any of the other embodiments in this specification as appropriate.

Embodiment 5

In this embodiment, examples of an electronic device that can include any of the storage device, the transistors, the CPU, and the like (e.g., a DSP, a custom LSI, a PLD, and an RF-ID) described in the above embodiments will be described.

The transistor, the storage device, and the CPU and the like described in the above embodiments can be applied to a variety of electronic devices (including game machines). Examples of the electronic devices include display devices such as televisions and monitors, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. The examples of the electronic devices also include alarm devices such as smoke detectors, heat detectors, gas alarm devices, and security alarm devices. The examples also include industrial equipment such as guide lights, traffic lights, belt conveyors, elevators, escalators, industrial robots, and power storage systems. Furthermore, moving objects and the like driven by fuel engines and electric motors using power from non-aqueous secondary batteries are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts. Some specific examples of these electronic devices are illustrated in FIGS. 18A to 18C.

Figure 18A:
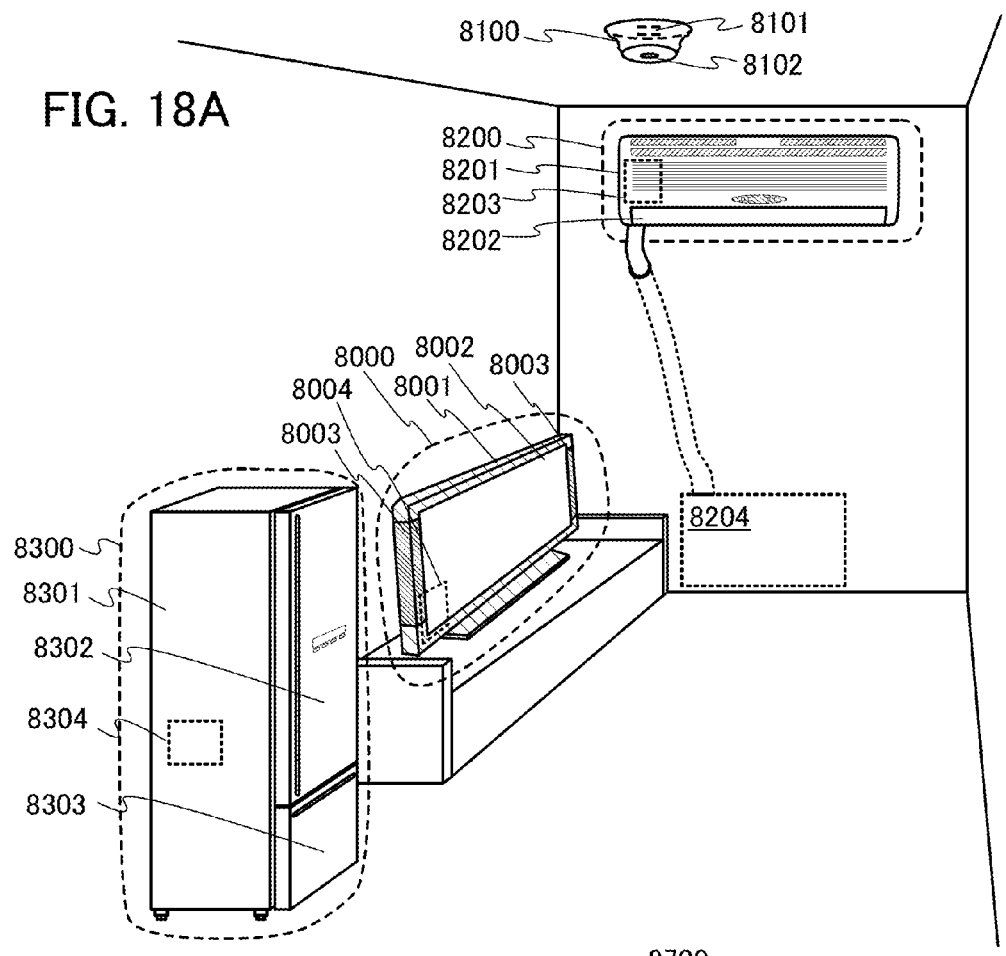
FIGS. 18A to 18C illustrate electronic devices to which semiconductor devices can be applied.
Figure 18B:
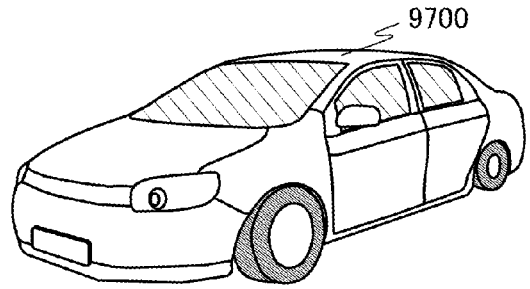
Figure 18C:
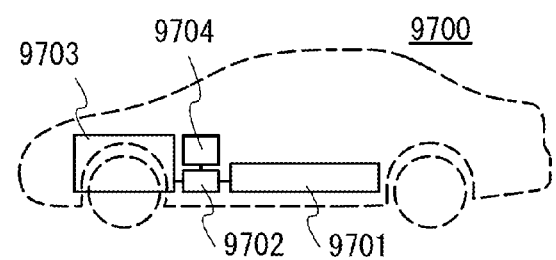

In a television set 8000 illustrated in FIG. 18A, a display portion 8002 is incorporated in a housing 8001. The display portion 8002 can display an image and a speaker portion 8003 can output sound. A storage device including the transistor of one embodiment of the present invention can be used for a driver circuit for operating the display portion 8002.

In addition, the television set 8000 may include a CPU 8004 for performing information communication or a memory. For the CPU 8004 and the memory, a CPU or a storage device including the transistor of one embodiment of the present invention can be used.

An alarm device 8100 illustrated in FIG. 18A is a residential fire alarm, and includes a smoke or heat sensor portion 8102 and a microcomputer 8101. The microcomputer 8101 is an example of an electronic device including any of the transistors, the storage device, and the CPU described in the above embodiments.

An air conditioner that includes an indoor unit 8200 and an outdoor unit 8204 illustrated in FIG. 18A is an example of an electronic device including any of the transistors, the storage device, the CPU, and the like described in the above embodiments. Specifically, the indoor unit 8200 includes a housing 8201, an air outlet 8202, a CPU 8203, and the like. Although the CPU 8203 is provided in the indoor unit 8200 in FIG. 18A, the CPU 8203 may be provided in the outdoor unit 8204. Alternatively, the CPU 8203 may be provided in each of the indoor unit 8200 and the outdoor unit 8204. When any of the transistors described in the above embodiments is used for the CPU in the air conditioner, reduction in power consumption of the air conditioner can be achieved.

An electric refrigerator-freezer 8300 illustrated in FIG. 18A is an example of an electronic device including any of the transistors, the storage device, the CPU, and the like described in the above embodiments. Specifically, the electric refrigerator-freezer 8300 includes a housing 8301, a door for a refrigerator 8302, a door for a freezer 8303, a CPU 8304, and the like. In FIG. 18A, the CPU 8304 is provided in the housing 8301. When any of the transistors described in the above embodiments is used for the CPU 8304 of the electric refrigerator-freezer 8300, power consumption of the electric refrigerator-freezer 8300 can be reduced.

FIGS. 18B and 18C illustrate an example of an electric vehicle that is an example of an electric device. The output of electric power of the secondary battery 9701 is adjusted by a circuit 9702 and the electric power is supplied to a driving device 9703. The circuit 9702 is controlled by a processing unit 9704 including a ROM, a RAM, a CPU, or the like that is not illustrated. When any of the transistors described in the above embodiments is used for the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in response to the control signal of the processing unit 9704 to control the output of the driving device 9703. In the case where an AC motor is mounted, although not illustrated, an inverter that converts a direct current into an alternate current is also incorporated.

This embodiment can be combined with any of the other embodiments in this specification as appropriate.

This application is based on Japanese Patent Application serial no. 2013-124508 filed with Japan Patent Office on Jun. 13, 2013, the entire contents of which are hereby incorporated by reference.

What is claimed is:

1. A semiconductor device comprising:
a memory cell comprising:
　a first transistor;
　a second transistor;
　a third transistor; and
　a capacitor,
wherein one of a source electrode and a drain electrode of the first transistor is electrically connected to one of a source electrode and a drain electrode of the third transistor and an electrode of the capacitor,
wherein a gate electrode of the second transistor is electrically connected to the other of the source electrode and the drain electrode of the third transistor,
wherein the first transistor and the third transistor each comprise an oxide semiconductor layer,
wherein a channel formation region of the second transistor comprises a semiconductor material other than an oxide semiconductor,
wherein the gate electrode of the second transistor is directly connected to only the third transistor, and
wherein the gate electrode of the second transistor is directly connected to only the other of the source electrode and the drain electrode of the third transistor.

2. The semiconductor device according to claim 1, wherein the oxide semiconductor layer includes:
　a first oxide semiconductor layer;
　a second oxide semiconductor layer over the first oxide semiconductor layer; and
　a third oxide semiconductor layer over the second oxide semiconductor layer.

3. The semiconductor device according to claim 2,
wherein an edge of the source electrode and an edge of the drain electrode of the first transistor are over and in contact with the second oxide semiconductor layer of the first transistor,
wherein the third oxide semiconductor layer of the first transistor is over and in contact with top surfaces of the edge of the source electrode and the edge of the drain electrode,
wherein the edge of the source electrode and a gate electrode of the first transistor overlap with each other, and
wherein the edge of the drain electrode and the gate electrode of the first transistor overlap with each other.

4. The semiconductor device according to claim 2, wherein the third oxide semiconductor layer is in direct contact with a side surface of the first oxide semiconductor layer and a side surface of the second oxide semiconductor layer.

5. The semiconductor device according to claim 2, wherein energy of a bottom of a conduction band of each of the first oxide semiconductor layer and the third oxide semiconductor layer is closer to a vacuum level than energy of a bottom of a conduction band of the second oxide semiconductor layer is, by 0.05 eV or more and 2 eV or less.

6. The semiconductor device according to claim 2,
wherein the first oxide semiconductor layer, the second oxide semiconductor layer, and the third oxide semiconductor layer each include an In-M-Zn oxide,
wherein M is one of Al, Ti, Ga, Y, Zr, La, Ce, Nd, and Hf, and
wherein an atomic ratio of M to In in each of the first oxide semiconductor layer and the third oxide semiconductor layer is higher than an atomic ratio of M to In in the second oxide semiconductor layer.

7. The semiconductor device according to claim 1, further comprising:
　a substrate; and
　an insulating film over the substrate,
wherein the first transistor is over the insulating film,
wherein the insulating film includes a first region and a second region and the first region of the insulating film and a channel formation region of the first transistor overlap with each other, and
wherein a thickness of the first region is larger than a thickness of the second region.

8. The semiconductor device according to claim 1, wherein the semiconductor material other than an oxide semiconductor is crystal silicon.

9. The semiconductor device according to claim 1, wherein the semiconductor device is used in one of a register and a cache memory.

10. The semiconductor device according to claim 1, wherein the semiconductor device is used in one of a register, a cache memory, a CPU, a custom LSI, an LSI, a programmable logic device and a radio frequency identification.

11. A semiconductor device comprising:
a memory cell comprising:
　a first transistor;
　a second transistor;
　a third transistor; and a capacitor, wherein one of a source electrode and a drain electrode of the first transistor is electrically connected to one of a source electrode and a drain electrode of the third transistor and a first electrode of the capacitor, wherein a gate electrode of the second transistor is electrically connected to the other of the source electrode and the drain electrode of the third transistor, wherein the other of the source electrode and the drain electrode of the first transistor is electrically connected to a first wiring, wherein a gate electrode of the first transistor is electrically connected to a second wiring, wherein one of a source electrode and a drain electrode of the second transistor is electrically connected to a third wiring, wherein the other of the source electrode and the drain electrode of the second transistor is electrically connected to a fourth wiring, wherein a gate electrode of the third transistor is electrically connected to a fifth wiring, wherein a second electrode of the capacitor is electrically connected to a sixth wiring, wherein the first transistor and the third transistor each comprise an oxide semiconductor layer, wherein a channel formation region of the second transistor comprises a semiconductor material other than an oxide semiconductor, wherein the semiconductor device is used in one of a register, a cache memory, a CPU, a custom LSI, an LSI, a programmable logic device and a radio frequency identification, wherein the gate electrode of the second transistor is directly connected to only the third transistor, and wherein the gate electrode of the second transistor is directly connected to only the other of the source electrode and the drain electrode of the third transistor.

12. The semiconductor device according to claim 11, wherein the oxide semiconductor layer includes:
   a first oxide semiconductor layer;
   a second oxide semiconductor layer over the first oxide semiconductor layer; and
   a third oxide semiconductor layer over the second oxide semiconductor layer.

13. The semiconductor device according to claim 12, wherein an edge of the source electrode and an edge of the drain electrode of the first transistor are over and in contact with the second oxide semiconductor layer of the first transistor, wherein the third oxide semiconductor layer of the first transistor is over and in contact with top surfaces of the edge of the source electrode and the edge of the drain electrode, wherein the edge of the source electrode and the gate electrode of the first transistor overlap with each other, and wherein the edge of the drain electrode and the gate electrode of the first transistor overlap with each other.

14. The semiconductor device according to claim 12, wherein the third oxide semiconductor layer is in direct contact with a side surface of the first oxide semiconductor layer and a side surface of the second oxide semiconductor layer.

15. The semiconductor device according to claim 12, wherein energy of a bottom of a conduction band of each of the first oxide semiconductor layer and the third oxide semiconductor layer is closer to a vacuum level than energy of a bottom of a conduction band of the second oxide semiconductor layer is, by 0.05 eV or more and 2 eV or less.

16. The semiconductor device according to claim 12,
   wherein the first oxide semiconductor layer, the second oxide semiconductor layer, and the third oxide semiconductor layer each include an In-M-Zn oxide,
   wherein M is one of Al, Ti, Ga, Y, Zr, La, Ce, Nd, and Hf, and
   wherein an atomic ratio of M to In in each of the first oxide semiconductor layer and the third oxide semiconductor layer is higher than an atomic ratio of M to In in the second oxide semiconductor layer.

17. The semiconductor device according to claim 11, further comprising:
   a substrate; and
   an insulating film over the substrate,
   wherein the first transistor is over the insulating film,
   wherein the insulating film includes a first region and a second region and the first region of the insulating film and a channel formation region of the first transistor overlap with each other, and
   wherein a thickness of the first region is larger than a thickness of the second region.

18. The semiconductor device according to claim 11,
   wherein the one of the source electrode and the drain electrode of the second transistor is electrically connected to a first electrode of a switch, and
   wherein a second electrode of the switch is electrically connected to the third wiring.

19. The semiconductor device according to claim 11, wherein the first wiring is electrically connected to the third wiring.

20. The semiconductor device according to claim 11, wherein the fourth wiring is electrically connected to the sixth wiring.

21. The semiconductor device according to claim 11, wherein the semiconductor material other than an oxide semiconductor is crystal silicon.

22. The semiconductor device according to claim 11, wherein the semiconductor device is used in one of the register and the cache memory.

* * * * *